US010615808B1

(12) United States Patent
Wang et al.

(10) Patent No.: US 10,615,808 B1
(45) Date of Patent: Apr. 7, 2020

(54) FREQUENCY SYNTHESIS WITH ACCELERATED LOCKING

(71) Applicant: Qualcomm Incorporated, San Diego, CA (US)

(72) Inventors: Kevin Jia-Nong Wang, Poway, CA (US); Shyam Sivakumar, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/132,173

(22) Filed: Sep. 14, 2018

(51) Int. Cl.
| | |
|---|---|
| *H03L 7/06* | (2006.01) |
| *H03L 7/093* | (2006.01) |
| *H03L 7/10* | (2006.01) |
| *H03L 7/107* | (2006.01) |
| *H04B 1/00* | (2006.01) |

(52) U.S. Cl.
CPC .............. *H03L 7/093* (2013.01); *H03L 7/102* (2013.01); *H03L 7/107* (2013.01); *H04B 1/0057* (2013.01)

(58) Field of Classification Search
CPC ......... H03L 7/0891; H03L 7/18; H03L 7/093; H03L 7/087; H03L 7/10
USPC .................................................. 327/105, 156
See application file for complete search history.

(56) References Cited

U.S. PATENT DOCUMENTS

| | | | |
|---|---|---|---|
| 5,890,051 A | 3/1999 | Schlang et al. | |
| 7,224,948 B1 | 5/2007 | Yamawaki et al. | |
| 7,242,229 B1 | 7/2007 | Starr et al. | |
| 7,522,690 B2 * | 4/2009 | Zhang | H03L 7/087 375/147 |
| 7,538,622 B2 * | 5/2009 | Feng | H03L 7/1974 327/156 |
| 7,646,223 B2 | 1/2010 | Kim et al. | |
| 7,714,625 B2 | 5/2010 | Chatterjee et al. | |

(Continued)

OTHER PUBLICATIONS

Lee, et al., "A 1.0-ns/1.0-V Delay-Locked Loop With Racing Mode and Countered CAS Latency Controller for DRAM Interfaces", IEEE Journal of Solid-State Circuits; Year: 2012; vol. 47, No. 6, pp. 1436-1447., Jun. 2012, 12 pages.

(Continued)

*Primary Examiner* — Anh Q Tra
(74) *Attorney, Agent, or Firm* — Colby Nipper/Qualcomm Incorporated

(57) ABSTRACT

An apparatus is disclosed that implements frequency synthesis with accelerated locking. In an example aspect, the apparatus includes an oscillating signal source, a modulus compensator, and a frequency generator. The oscillating signal source is configured to provide a reference signal having a reference frequency. The modulus compensator is coupled to the oscillating signal source and is configured to receive the reference signal. The modulus compensator is configured to produce a compensated modulus value based on the reference frequency, a fixed oscillator frequency of a fixed-frequency oscillator signal, and a modulus value. The frequency generator is coupled to the oscillating signal source and the modulus compensator and is configured to receive the compensated modulus value. The frequency generator is configured to generate an output signal having an output frequency that is based on the reference frequency and the compensated modulus value.

30 Claims, 9 Drawing Sheets

(56) References Cited

U.S. PATENT DOCUMENTS

| | | | | |
|---|---|---|---|---|
| 7,714,666 B2* | 5/2010 | Ke | ............ | H03C 3/0925 |
| | | | | 327/156 |
| 8,188,776 B2* | 5/2012 | Kumagai | ............ | H03L 7/183 |
| | | | | 327/156 |
| 8,279,014 B2 | 10/2012 | Chen et al. | | |
| 8,537,957 B2* | 9/2013 | Lesso | ............ | H03L 7/087 |
| | | | | 375/371 |
| 8,595,518 B2 | 11/2013 | Kii | | |
| 8,643,414 B1 | 2/2014 | Navid | | |
| 8,760,202 B1 | 6/2014 | Sinha et al. | | |
| 9,602,113 B2 | 3/2017 | Galton et al. | | |
| 9,762,220 B2 | 9/2017 | Han et al. | | |
| 10,236,899 B1* | 3/2019 | Tope | ............ | H03L 7/102 |
| 10,374,651 B1 | 8/2019 | Sivakumar et al. | | |
| 2004/0164809 A1* | 8/2004 | Gibbs | ............ | H03L 7/1976 |
| | | | | 331/1 A |
| 2010/0045391 A1* | 2/2010 | Wang | ............ | H03L 7/10 |
| | | | | 331/1 R |
| 2011/0084768 A1* | 4/2011 | Hammond | ............ | H03L 7/1806 |
| | | | | 331/18 |
| 2012/0105114 A1* | 5/2012 | Yun | ............ | H03L 7/0891 |
| | | | | 327/156 |
| 2014/0351615 A1* | 11/2014 | Gupta | ............ | H03K 19/0016 |
| | | | | 713/322 |
| 2016/0226502 A1* | 8/2016 | Cali | ............ | H03L 7/1974 |

OTHER PUBLICATIONS

Skolota, et al., "Development Synthesizer of Stable High-Frequency Signal", Micro/Nanotechnologies and Electron Devices (EDM), 2016 17th International Conference of Young Specialists on. IEEE, 2016, 2016, 6 pages.

* cited by examiner

FREQUENCY SYNTHESIS WITH ACCELERATED LOCKING

TECHNICAL FIELD

This disclosure relates generally to electronic devices as well as the integrated circuits thereof and, more specifically, to facilitating the use of frequency synthesizers used for communication and control signaling by accelerating the locking of a frequency generator that is part of a frequency synthesizer.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, programmable thermostats, automotive electronics, robotics, intelligent devices embedded in other machines like refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among distributed electronic devices using wireless or wired signals that are transmitted over one or more networks, such as the Internet or a cellular network. Electronic communications can also include those exchanged between or among different printed circuit boards, modules, chips, or even cores of a given integrated circuit that are located within a single electronic device. Regardless, electronic communications are usually accomplished by generating or propagating signals. Such electronic communications are typically performed using at least one signal that is designed to have a specified characteristic, such as a particular frequency. Generally, communication signals are more likely to be correctly transmitted and received, as well as properly interpreted, if the specified signal characteristic is accurately and reliably produced.

With regard to a frequency signal characteristic, a frequency synthesizer can be used to create, or synthesize, a desired frequency. Thus, electronic devices employ frequency synthesizers to synthesize signals having desired frequencies. Typically, a frequency synthesizer includes a frequency generator. Examples of frequency generators include a phase locked loop (PLL), a frequency locked loop (FLL), and so forth. In operation, a frequency generator receives a reference signal having a reference frequency and applies the reference signal to a feedback loop. Using the feedback loop, the circuitry of the frequency generator generates an output signal that oscillates at a desired output frequency in a stable and accurate manner based on the reference frequency. The frequency generator can derive the output frequency of the output signal based on the reference signal, such as by driving the output frequency to have some multiple of the reference frequency of the reference signal.

A frequency synthesizer therefore outputs an oscillating signal having some desired frequency. The electronic device can use the synthesized frequency of the oscillating output signal in one or more stages of a communication scenario. Example stages for communicating an electromagnetic signal include generating, transmitting, receiving, and interpreting a communication signal. In an example signal-generation stage, a frequency generated by a frequency synthesizer can be used to modulate a communication signal. Here, the modulation entails encoding or adding information—such as a text and an associated photograph—to the communication signal. In an example signal-transmission stage, a frequency generated by a frequency synthesizer can be employed to upconvert a frequency of a modulated communication signal using a mixer. With an up-conversion operation, the mixer increases the frequency of the communication signal, such as to enable the communication signal to be transmitted wirelessly as a radio frequency (RF) signal between a smartphone and a cellular base station.

A frequency synthesizer can also be used with the stages of a reception side of a typical communication scenario. For instance, a frequency synthesizer can be used to down-convert a frequency of a received communication signal. After down-conversion, a frequency synthesizer can be used to demodulate the down-converted communication signal to interpret the signal and thereby recover encoded information, such as the text message along with the associated photograph. Additionally, a frequency synthesizer can be used to produce a clock signal that controls a rate of operation of clock-synchronized circuitry of an integrated circuit. Examples of such integrated circuits include a system-on-chip (SoC) that processes a communication signal and a graphics chip that processes video data that is being displayed to a user.

Thus, frequency synthesizers can be employed in multiple stages of a communication scenario to support electronic communications with electronic devices and in synchronous circuitry to support coordinated interoperations among different components of electronic devices. Consequently, electrical engineers and other designers of electronic devices strive to improve the functionality and usability of frequency synthesizers to facilitate electronic communications and high-speed synchronous operations by electronic devices.

SUMMARY

Frequency synthesis with accelerated locking is disclosed herein. In some implementations, a reference signal for a frequency generator has a reference frequency that is greater than a fixed oscillator frequency of a fixed-frequency oscillator signal. The higher frequency of the reference signal is input to the frequency generator to expedite a locking of the frequency generator to the input signal. To accommodate the frequency difference between the reference frequency and the fixed oscillator frequency, a compensated modulus value is produced and provided to the frequency generator as a frequency divider value of a feedback loop. The compensated modulus value is computed based on a modulus value provided by a system designer or user so that the output frequency of the output signal of the frequency generator matches the user's intended output frequency expected by a downstream component that is to use the output signal. Additionally, to maintain an acceptable precision for the output frequency of the output signal, the reference frequency is estimated using the more accurate fixed oscillator frequency, and the compensated modulus value is further computed based on this estimated frequency. The accelerated locking reduces latency coming out of a low-power mode. Thus, power management strategies that reduce power consumption can be pursued while incurring less impact on device performance by implementing frequency synthesis with accelerated locking as described herein.

An apparatus that can implement frequency synthesis with accelerated locking is disclosed herein. Example implementations of the disclosed apparatus include an oscillating signal source, a modulus compensator, and a frequency generator. The oscillating signal source is configured to provide a reference signal having a reference frequency. The modulus compensator is coupled to the oscillating signal source and is configured to receive the reference signal. The modulus compensator is configured to produce a compensated modulus value based on the reference frequency, a fixed oscillator frequency of a fixed-frequency oscillator signal, and a modulus value. The frequency generator is coupled to the oscillating signal source and the modulus compensator and is configured to receive the compensated modulus value. The frequency generator is configured to generate an output signal having an output frequency that is based on the reference frequency and the compensated modulus value.

In an example aspect, a system is disclosed. The system includes an oscillating signal source configured to provide a reference signal having a reference frequency. The system also includes compensation means for producing a compensated modulus value to compensate for a difference between a fixed oscillator frequency of a fixed-frequency oscillator signal and the reference frequency of the reference signal. The compensation means is coupled to the oscillating signal source. The system further includes frequency generation means for generating an output signal having an output frequency that is based on the reference frequency and the compensated modulus value. The frequency generation means is coupled to the oscillating signal source and the compensation means.

In an example aspect, a method for frequency synthesis to enable accelerated locking is disclosed. The method includes obtaining a reference signal having a reference frequency and obtaining a fixed-frequency oscillator signal having a fixed oscillator frequency. The method also includes producing a compensated modulus value based on the reference signal, the fixed-frequency oscillator signal, and a modulus value. The method additionally includes providing the compensated modulus value and a version of the reference signal to a frequency generator. The method further includes generating, using the frequency generator, an output signal based on the compensated modulus value and the version of the reference signal.

In an example aspect, an apparatus is disclosed. The apparatus includes a low-power mode frequency synthesizer. The low-power mode frequency synthesizer includes an oscillating signal source, a frequency divider, a frequency estimator, a compensated modulus calculator, and a frequency generator. The oscillating signal source is configured to provide a reference signal having a reference frequency. The frequency divider is coupled to the oscillating signal source and is configured to produce a version of the reference signal having a version of the reference frequency based on the reference signal. The frequency estimator is coupled to the oscillating signal source. The frequency estimator is configured to produce an estimation signal indicative of an estimated frequency of the reference signal based on the reference signal and a fixed-frequency oscillator signal. The compensated modulus calculator is coupled to the frequency estimator and is configured to compute a compensated modulus value based on the estimation signal and a modulus value. The frequency generator is coupled to the frequency divider and the compensated modulus calculator. The frequency generator is configured to generate an output signal having an output frequency that is based on the version of the reference signal and the compensated modulus value.

DETAILED DESCRIPTION

Figure 1:
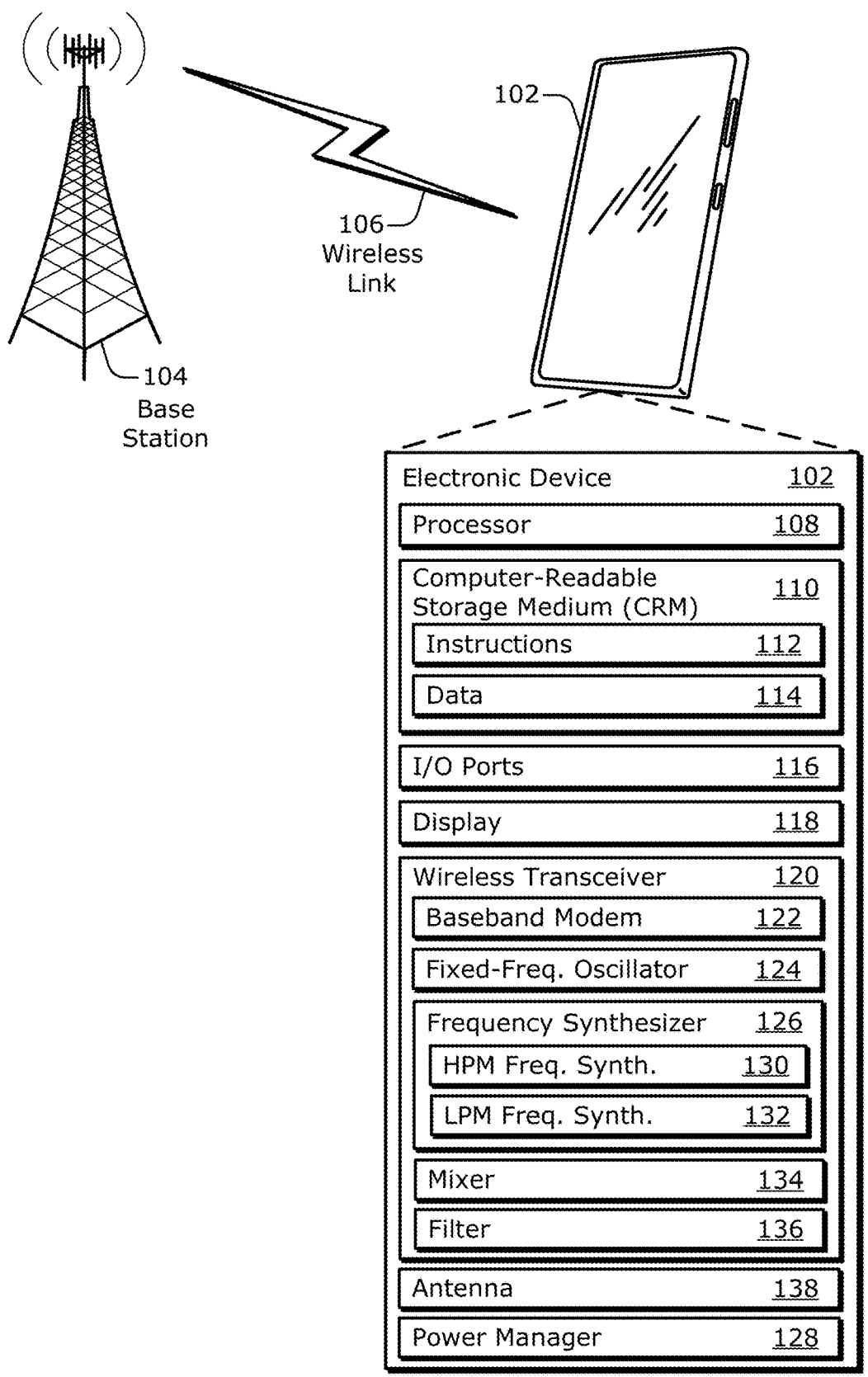
FIG. 1 illustrates an example environment including an electronic device with a frequency synthesizer in which frequency synthesis with accelerated locking can be implemented.

Generally, electronic communications are made using signals that oscillate at different frequencies. Electronic devices use various components to create signals having different signal characteristics, such as frequency synthesizers to create signals having desired frequencies. To do so, an oscillating signal is input to a frequency generator that produces a signal having a desired frequency characteristic to facilitate electronic communications. In addition to enabling communication signaling, frequency synthesizers are often used to generate clock signals that control the timing of processing operations in integrated circuits, such as a central processing unit (CPU), a graphics processing unit (GPU), or a system-on-chip (SoC).

Thus, electronic devices can use oscillating signals that rise and fall at some frequency, which can be realized as a series of pulses having rising edges and falling edges. For example, electronic devices use oscillating signals to control a rate of processing operations (e.g., with a clock signal) or to facilitate the transmission and reception of signals in different communication scenarios (e.g., with mixers that perform frequency conversions). These various oscillating signals can be generated by a frequency synthesizer using a frequency generator, which includes circuitry that implements some type of locked loop. The frequency generator produces an oscillating output signal based on a reference signal and a modulus value. The modulus value controls how the frequency generator changes the reference signal to produce the output signal. Examples of locked loops include a phase-locked loop (PLL) and a frequency-locked loop (FLL). By enabling the generation of signals having different frequency characteristics, frequency generators are instrumental in facilitating our modern interconnected society that relies on electronic devices with high-speed processing and communication signaling.

However, frequency generators present a number of issues with respect to power management, and power management enables electronic devices to use less energy overall and battery-powered ones to last longer between charges. For example, there is a tension, or tradeoff, between reducing the power usage by frequency generators and reducing operational latency. In other words, reducing power consumption often results in an increase in the quantity or length of occurrences during which an electronic device is waiting on a frequency generator to become fully functional. This latency-induced waiting causes the electronic device to be delayed before performing some computation and then providing some feature to a user.

More specifically, the locked loops of frequency generators can consume an appreciable amount of power while running, especially at higher frequencies that result from using a fixed-frequency oscillator with a relatively higher oscillation frequency. To help manage power usage, some electronic devices can switch between a high-power mode (HPM) and a low-power mode (LPM). To support the low-power mode with a frequency synthesizer, a power manager can switch from a HPM fixed-frequency oscillator with a relatively higher oscillation frequency to a LPM fixed-frequency oscillator with a relatively lower oscillation frequency. This approach is effective because using a lower oscillation frequency generally consumes less power. A relatively higher oscillation frequency can be, for example, in the tens of megahertz (10s of MHz) while a relatively lower oscillation frequency can be in the tens of kilohertz (10s of KHz).

In addition to or in conjunction with a high-power mode and a low-power mode, a power manager can enter a standby mode to further reduce the power consumption of a locked loop of a frequency generator. For the standby mode, the power manager at least partially turns off the locked loop by causing the locked loop to cease running. However, while the locked loop is not running, the loop can drift out of lock due to temperature or voltage changes. Each time a locked loop is restarted at the end of a standby period, some duration of time elapses before the locked loop can relock to a reference characteristic of a reference signal and produce an appropriate output signal (e.g., an oscillating output signal having a desired frequency). Consequently, implementing a power-management strategy including a standby mode that causes a locked loop to cease running creates a repetitive delay that adversely impacts the performance of an electronic device.

An average length of this repetitive delay can be quantified. When a locked loop is restarted after a standby period, some amount of time elapses while the locked loop relocks to a reference characteristic—such as a reference frequency—of a reference signal and begins producing an output signal having an output frequency that is based on the reference characteristic (e.g., that is a multiple of the reference frequency). This relocking duration corresponds to the repetitive delay that causes a frequency-synthesis latency that can result in a user-perceivable performance penalty. In some cases, approximately 100 cycles of the reference signal are applied to a reawakened loop before the locked loop can relock to the reference frequency. This results in significantly less impact during a high-power mode because the relatively higher oscillation frequency means much less time elapses over the 100 periods. However, with reference signals having relatively lower frequencies, as with a low-power mode, a relocking duration equal to 100 times a period of the reference signal can introduce a significant delay each time the locked loop is restarted after a standby mode ends. Especially with repeated sleep and wake cycles that occur during a low-power mode, the repeated relocking delay can adversely impact user experience with an electronic device.

To counteract the repetitive delays caused by a lengthy relocking duration during a low-power mode, a digital locked loop can be implemented and the following relocking strategy employed. First, with a digital locked loop, a faster relocking can be accomplished via a binary search through a digitally-controlled oscillator (DCO) control word. Second, a faster relocking can be established by relaxing the requirements for achieving a "lock" of the digital locked loop to a reference signal. Together, these two changes can reduce the relocking duration by a factor of ten—e.g., from approximately 100 cycles to approximately 10 cycles of the reference signal. However, this strategy depends on a quality of the binary search as well as variable analog quantities. Further, such a strategy results in an inferior initial lock condition due to the lowered locking threshold. Also, although the delays may be reduced at times, the relocking durations have large, unpredictable variances, so this strategy provides designers less certainty. Moreover, this strategy focuses on properties of a digital locked loop. Consequently, the strategy is inapplicable to analog locked loops.

In contrast with the digital-based strategy proposed above, an ancillary oscillator can be deployed with both digital and analog locked loops as described herein. A relocking duration for a frequency generator can be decreased by increasing a frequency of the reference signal that is input to the frequency generator using an ancillary oscillator. For example, a voltage-based oscillator, such as a ring oscillator, can be used to produce a reference signal having a reference frequency. The reference frequency is higher than that of a relatively lower oscillation frequency of a fixed-frequency oscillator that is active during a low-power mode. Although approximately 100 cycles may still occur before a lock is achieved, the 100-cycle locking period is therefore shorter with the ancillary oscillator. However, operation of a voltage-based oscillator is sensitive to a variation in at least one of a process, a voltage, or a temperature (e.g., PVT variations). Because these factors vary during manufacturing or operating times, a straightforward implementation using a voltage-based oscillator can produce an unpredictable and variable frequency for a reference signal that is provided to a frequency generator.

To address the frequency imprecision that can arise from PVT variations with a voltage-based oscillator, implementations described herein use a combination of two or more different oscillation signals to drive a frequency generator. This combination of oscillation signals includes a relatively precise fixed-frequency oscillator signal from a fixed-frequency oscillator and a less precise, but higher-frequency, voltage-based reference signal from a voltage-based oscillator. The higher frequency of the voltage-based oscillation signal generates many more cycles per second (e.g., on the order of 1000 times more cycles per second) to enable locking by a locked loop of a frequency generator in a substantially shorter time. The precise frequency of the fixed-frequency oscillation signal is used to analyze the higher frequency of the voltage-based oscillation signal and provide a compensated modulus value to the frequency generator. The compensated modulus value can compensate for PVT variations such that the frequency generator provides an output signal having a reliably-precise output frequency. Consequently, the frequency generator locks relatively quickly using the higher-frequency reference signal, but an accuracy comparable to that provided by a fixed-frequency oscillator oscillation signal is still maintained via the compensated modulus value. A frequency synthesizer, or a frequency generator thereof, can therefore be awakened after a standby mode and readied for usage with lower latency and thus with less impact on device performance.

In some implementations for frequency synthesis with accelerated locking, a frequency synthesizer produces an output signal having an output frequency $f_{out}$. The frequency synthesizer has input parameters including a fixed oscillator frequency $f_{fo}$ from a fixed-frequency oscillator signal and a modulus value (N). The modulus value can be provided by a system user based on the known fixed oscillator frequency $f_{fo}$ to achieve a target output frequency. The frequency synthesizer includes an oscillating signal source, a modulus compensator, and a frequency generator. The frequency generator can be implemented with, for example, an analog frequency-locked loop (FLL), a digital frequency-locked loop (FLL), an analog phase-locked loop (PLL), or a digital phase-locked loop (PLL).

The oscillating signal source, such as a voltage-based oscillating signal source, provides a reference signal having a reference frequency $f_{ref}$. A version of the reference signal is routed to an input of the frequency generator, with the version of the reference signal comprising an unmodified version of the reference signal $f_{ref}$ or a frequency-divided version of the reference signal $f_{ref}$ that is produced by a frequency divider. In an example operation, the modulus compensator produces a compensated modulus value (N') based on the reference frequency $f_{ref}$ of the reference signal, the fixed oscillator frequency $f_{fo}$ of the fixed-frequency oscillator signal, and the modulus value (N). The compensated modulus value (N') is routed to the frequency generator, such as a frequency divider that is an internal part of a locked loop of the frequency generator. The frequency generator generates an output signal having an output frequency $f_{out}$ that is based on a version of the reference frequency $f_{ref}$ corresponding to a version of the reference signal and the compensated modulus value (N').

The version of the reference frequency $f_{ref}$ can be orders of magnitude (e.g., two to four orders of magnitude) greater than the fixed oscillator frequency $f_{fo}$. Thus, a given number of cycles of the version of the reference frequency $f_{ref}$ that elapse to lock the frequency generator occur over a relatively shorter time, as compared to if the fixed-frequency oscillator signal were directly coupled to the input of the frequency generator. However, an accuracy or consistent precision of the reference frequency $f_{ref}$ is undependable relative to that of the fixed oscillator frequency $f_{fo}$. Accordingly, the modulus compensator operates to at least ameliorate the imprecision by producing the compensated modulus value (N') for coupling to the frequency generator. The modulus compensator includes a frequency estimator and a compensated modulus calculator. The frequency estimator uses the fixed oscillator frequency $f_{fo}$ to estimate a frequency of the reference frequency $f_{ref}$ and produce an estimation signal indicative of an estimated frequency $f_{est}$.

The compensated modulus calculator of the modulus compensator computes the compensated modulus value (N') based on the fixed oscillator frequency $f_{fo}$, the estimated frequency $f_{est}$, the modulus value N from a user, and a frequency divider value M of a frequency divider that is external to the frequency generator (if any). The compensated modulus calculator computes the compensated modulus value (N') such that the frequency generator generates the output signal to have the targeted output frequency $f_{out}$ based on the compensated modulus value (N') and the version of the reference frequency $f_{ref}$ that is supplied to the frequency generator. In other words, in some implementations, the compensated modulus value (N') is determined such that a product of the version of the reference frequency ($f_{ref}$ or $f_{ref}/M$) and the compensated modulus value (N') equals a targeted output frequency $f_{out}$ that would be produced by a product of the fixed oscillator frequency $f_{fo}$ and the modulus value (N) provided by a user (e.g., an operator or system engineer).

In these manners, a high-frequency reference signal from a voltage-based oscillating signal source can be used during a low-power mode to quickly restart a frequency generator of a frequency synthesizer without sacrificing an accuracy of the output frequency. Consequently, a locked loop of the frequency generator can be awakened and relocked after a system exits a sleep period with shorter delays and therefore with less impact on device performance. This enables a power manager to apply a more aggressive power-saving algorithm to better conserve power and further extend battery life.

FIG. 1 illustrates an example environment 100 that includes an electronic device 102 with a frequency synthesizer 126 in which frequency synthesis with accelerated locking can be implemented. The example environment 100 includes the electronic device 102 that communicates with a base station 104 through a wireless link 106. In this example, the electronic device 102 is implemented as a smart phone. However, the electronic device 102 may be implemented as any suitable computing or other electronic device, such as a modem, cellular base station, broadband router, access point, cellular phone, gaming device, navigation device, media device, laptop computer, desktop computer, tablet computer, wearable device such as a smart watch or augmented reality (AR) glasses, server computer, network-attached storage (NAS) device, smart appliance, vehicle-based communication system, Internet-of-Things (IoT) device, battery-charging apparatus, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, cloud computing hardware, access point, peer-to-peer device, mesh network node, fiber optic line, another electronic device generally, and so forth. Hence, the electronic device 102 may communicate with the base station 104 or another electronic device via a wired connection, a wireless connection, or a combination thereof.

The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE) (e.g., Fourth- Generation (4G) or Fifth-Generation (5G) wireless standards), IEEE 802.11, IEEE 802.16, Bluetooth™, and so forth.

The electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, microphones, cameras, other sensors, and so forth. The display 118 can be realized as a screen or projection that presents graphics of the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes at least one wireless transceiver 120 and at least one antenna 138. The wireless transceiver 120 provides connectivity to respective networks, electronic devices connected therewith, and other electronic devices. Additionally or alternatively, the electronic device 102 may include a wired transceiver (not shown), such as an Ethernet or fiber optic interface for communicating over a personal or local area network (LAN), an intranet, or the Internet. The wireless transceiver 120 may facilitate communication over any suitable type of wireless network, such as a wireless LAN (WLAN), a peer-to-peer (P2P) network, a mesh network, a cellular network, a wireless wide-area-network (WWAN), and/or a wireless personal-area-network (WPAN). In the context of the example environment 100, the wireless transceiver 120 enables the electronic device 102 to communicate at least with the base station 104 and networks connected therewith.

The wireless transceiver 120 can include circuitry, logic, and other hardware for transmitting or receiving a wireless signal for at least one communication frequency band. In operation, the wireless transceiver 120 can implement at least one, e.g., radio frequency (RF) transceiver to process data and/or signals associated with communicating data of the electronic device 102 via the antenna 138. As shown, the wireless transceiver 120 includes at least one baseband modem 122. The baseband modem 122 may be implemented as a system on-chip (SoC) that provides a digital communication interface for data, voice, messaging, and other applications of the electronic device 102. In addition to circuitry for modulating and demodulating a signal, the baseband modem 122 may include baseband circuitry to perform high-rate sampling processes that can include analog-to-digital conversion (ADC), digital-to-analog conversion (DAC), gain correction, skew correction, frequency translation, and so forth. Alternatively, the baseband modem 122 may be implemented separately from the wireless transceiver 120.

Generally, the wireless transceiver 120 can include lowpass filters, bandpass filters, mixers, switches, amplifiers, and so forth for routing and conditioning signals that are transmitted or received via the antenna 138. As illustrated, the wireless transceiver 120 includes at least one fixed-frequency oscillator 124, at least one frequency synthesizer 126, at least one mixer 134, and at least one filter 136. In operation, the wireless transceiver 120 can provide for wireless signals some measure of attenuation at different frequencies using the filter 136 (e.g., a lowpass or bandpass filter). The wireless transceiver 120 can further perform frequency conversion using the mixer 134 and a signal synthesized by the frequency synthesizer 126 in conjunction with the fixed-frequency oscillator 124. A frequency conversion process performed using the mixer 134 can involve an upconverter and/or a downconverter that performs frequency conversion in a single conversion step or through multiple conversion steps.

The wireless transceiver 120 may also include logic to perform in-phase/quadrature (I/Q) operations, such as synthesis, encoding, modulation, demodulation, and decoding using a synthesized signal. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., using separate transmit and receive chains).

As shown, the electronic device 102 also includes at least one power manager 128 that is configured to institute one or more power modes, such as a low-power mode (LPM), a high-power mode (HPM), a standby mode, combinations thereof, and so forth. The frequency synthesizer 126 includes a high-power mode frequency synthesizer 130 (HPM frequency synthesizer 130) and a low-power mode frequency synthesizer 132 (LPM frequency synthesizer 132). The fixed-frequency oscillator 124 and the frequency synthesizer 126 can be used to generate signals having one or more desired characteristics, such as a target frequency, for use by the mixer 134, by clock generation circuitry (not shown), and so forth.

The fixed-frequency oscillator 124 can be realized in different manners using one or more components. Generally, the fixed-frequency oscillator 124 provides a substantially stable fixed oscillator frequency as environmental parameters, such as temperature or voltage, change over time. Example components for at least partially implementing the fixed-frequency oscillator 124 include an atomic clock, a microelectromechanical system (MEMS)-based resonator, a temperature-compensated oscillator, an oscillator in a temperature-controlled chamber or other space, a crystal oscillator (XO), a FLL or PLL that is locked to a crystal oscillator, or combinations thereof. Although a fixed-frequency oscillator 124 provides a fixed-frequency oscillator signal having a relatively stable fixed oscillator frequency, the fixed-frequency oscillator 124 may utilize an appreciable amount of power, especially at higher fixed frequencies. Using a lower-powered frequency generation scheme can therefore extend battery life of portable electronic devices.

In operation, the power manager 128 implements one or more techniques to manage power consumption across a system or over one or more components of the electronic device 102. Generally, a frequency synthesizer 126 or a combination of a frequency synthesizer 126 and a power manager 128 can at least partially implement frequency synthesis with accelerated locking as described herein. An example frequency synthesizer 126 is described with reference to FIG. 2. An example HPM frequency synthesizer 130, which includes a frequency generator, is described with reference to FIG. 3. An example LPM frequency synthesizer 132—which includes a frequency generator, an oscillating signal source, and a modulus compensator—is described with reference to FIG. 4. Example implementations of a modulus compensator are described with reference to FIGS. 5 and 6. An example of a frequency generator that is realized as a PLL is described with reference to FIG. 7.

Figure 2:
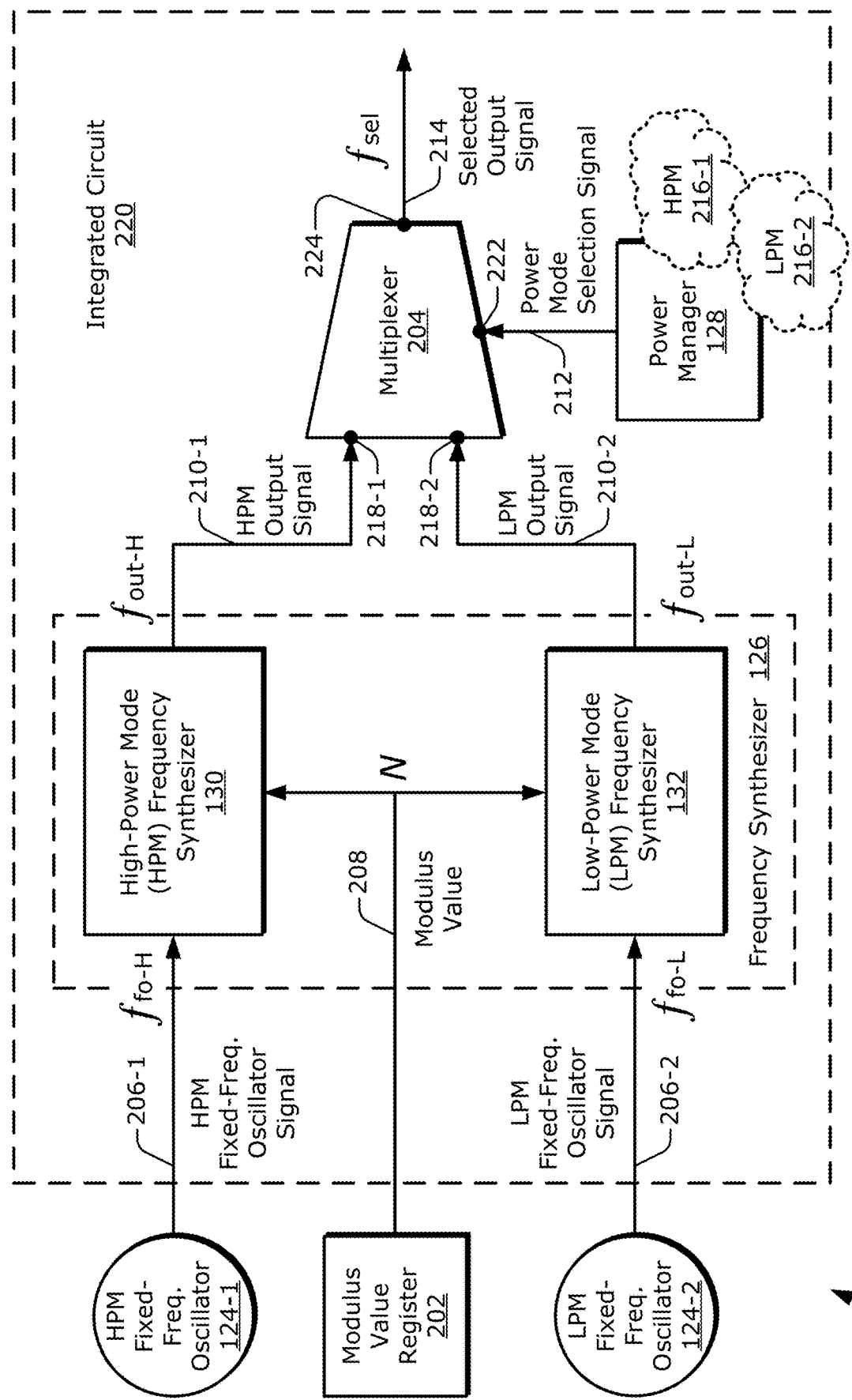
FIG. 2 illustrates an example frequency synthesizer including a high-power mode frequency synthesizer and a low-power mode frequency synthesizer that operate in conjunction with a power manager for an implementation of frequency synthesis with accelerated locking.

FIG. 2 illustrates, generally at 200, an example frequency synthesizer 126 including a HPM frequency synthesizer 130 and a LPM frequency synthesizer 132 that operate in conjunction with a power manager 128 for an implementation of frequency synthesis with accelerated locking. FIG. 2 includes a HPM fixed-frequency oscillator 124-1 and a LPM fixed-frequency oscillator 124-2. Thus, in some implementations, the fixed-frequency oscillator 124 of FIG. 1 can be realized using multiple fixed-frequency oscillators, such as the two shown in FIG. 2. The HPM fixed-frequency oscillator 124-1 and the LPM fixed-frequency oscillator 124-2 can be implemented using any same or different fixed-frequency scheme, including one or more of those described above with reference to FIG. 1. For instance the HPM fixed-frequency oscillator 124-1 or the LPM fixed-frequency oscillator 124-2 (or both) can be implemented using a crystal oscillator that produces a crystal oscillator signal having a crystal oscillator frequency in response to application of a voltage to a quartz crystal or other piezoelectric material. Also shown in FIG. 2 is a modulus value register 202 and an integrated circuit 220. Multiple components are illustrated as being disposed on the integrated circuit 220. These components include the HPM frequency synthesizer 130, the LPM frequency synthesizer 132, the power manager 128, and a multiplexer 204.

Although FIG. 2 depicts certain components as being arranged in a particular manner, these components may be arranged in alternative manners. For example, in some electronic devices, the integrated circuit 220, the modulus value register 202, or either or both of the HPM fixed-frequency oscillator 124-1 and the LPM fixed-frequency oscillator 124-2 may be disposed together on a same printed circuit board (PCB) (not shown) or on different PCBs. Although shown apart from the integrated circuit 220, either or both the HPM fixed-frequency oscillator 124-1 and the LPM fixed-frequency oscillator 124-2 may be disposed on the integrated circuit 220. For instance, the LPM fixed-frequency oscillator 124-2 can be disposed proximate to the LPM frequency synthesizer 132 on the integrated circuit 220. Further, the power manager 128 may be part of a separate integrated circuit.

As illustrated, the HPM fixed-frequency oscillator 124-1 is coupled to an input of the HPM frequency synthesizer 130. An output of the HPM frequency synthesizer 130 is coupled to an input (e.g., a first input) of the multiplexer 204. The LPM fixed-frequency oscillator 124-2 is coupled to an input of the LPM frequency synthesizer 132. An output of the LPM frequency synthesizer 132 is coupled to another input (e.g., a second input) of the multiplexer 204. The modulus value register 202 is coupled to respective inputs (e.g., respective frequency control inputs) of the HPM frequency synthesizer 130 and the LPM frequency synthesizer 132 to provide a same modulus value 208 (N) or two different modulus values 208 (N) to the two frequency synthesizers. Alternatively, two modulus value registers can be implemented with each respective modulus value register configured to provide a respective modulus value 208 to a respective one of the two frequency synthesizers. The power manager 128 is coupled to another input (e.g., a control input) of the multiplexer 204.

In operation, the power manager 128 is responsible for establishing multiple power modes 216-1 to 216-2 for the electronic device 102 of FIG. 1, for a communication system of the device, for an RF front end (RFFE) of the device, for the wireless transceiver 120, for the frequency synthesizer 126, any combination thereof, and so forth. This establishment may entail determining to institute a particular power mode based on one or more factors or activating a power mode responsive to an instruction from another component or a higher processing layer. Example power modes include a high-power mode 216-1 (HPM 216-1) and a low-power mode 216-2 (LPM 216-2). However, the power manager 128 can establish more or different power modes, such as a standby power mode. The terms high-power mode and low-power mode are relative terms. Thus, although more than two power modes may be implemented, the high-power mode uses relatively more power than the low-power mode. Examples of the high-power mode and the low-power mode include a boost power mode and a regular power mode, respectively. Other power modes may use more, less, or an intermediate amount of power compared to either the high-power mode 216-1 or the low-power mode 216-2.

To control an output frequency of the frequency synthesizers, the modulus value register 202 stores at least one modulus value 208. The modulus value 208 can be specified by a user at a design stage or at an operational stage. The modulus value 208 can also be changed or adjusted, including during operation. Each fixed-frequency oscillator 124 provides a stable output called a fixed-frequency oscillator signal 206 having a fixed oscillator frequency $f_{fo}$. The HPM fixed-frequency oscillator 124-1 provides a HPM fixed-frequency oscillator signal 206-1 having a HPM fixed oscillator frequency $f_{fo-H}$ that corresponds to the high-power mode 216-1. The LPM fixed-frequency oscillator 124-2 provides a LPM fixed-frequency oscillator signal 206-2 having a LPM fixed oscillator frequency $f_{fo-L}$ that corresponds to the low-power mode 216-2.

Typically, the HPM fixed oscillator frequency $f_{fo-H}$ is significantly higher than the LPM fixed oscillator frequency $f_{fo-L}$, such as at least two orders of magnitude greater. This relative frequency difference causes the HPM frequency synthesizer 130 to use more power in the high-power mode 216-1 than does the LPM frequency synthesizer 132 in the low-power mode 216-2. In operation, the HPM frequency synthesizer 130 produces a high-power mode output signal 210-1 having a high-power mode output frequency $f_{out-H}$ based on the HPM fixed-frequency oscillator signal 206-1 and the modulus value 208. For example, the HPM output frequency $f_{out-H}$ can be approximately equal to a product of the HPM fixed oscillator frequency $f_{fo-H}$ and the modulus value 208 (N). The LPM frequency synthesizer 132 produces a low-power mode output signal 210-2 having a low-power mode output frequency $f_{out-L}$ based on the LPM fixed-frequency oscillator signal 206-2 and the modulus value 208. For example, the LPM output frequency $f_{out-L}$ can be approximately equal to a product of the LPM fixed oscillator frequency $f_{fo-L}$ and the modulus value 208 (N). Thus, at least one modulus value 208 (N) can comprise a user-provided value to specify a desired output frequency $f_{out}$ of an output signal 210, whether for the HPM frequency synthesizer 130 or the LPM frequency synthesizer 132.

The HPM frequency synthesizer 130 provides the HPM output signal 210-1 to a first input 218-1 of the multiplexer 204. The LPM frequency synthesizer 132 provides the LPM output signal 210-2 to a second input 218-2 of the multiplexer 204. The power manager 128 provides a power mode selection signal 212 to a control input 222 of the multiplexer 204. Here, the power mode selection signal 212 is indicative of whether the high-power mode 216-1 or the lower-power mode 216-2 is currently active. Responsive to a respective HPM or LPM value of the power mode selection signal 212, the multiplexer 204 routes a respective HPM or LPM output signal 210-1 or 210-2 to an output 224 of the multiplexer 204. Thus, the multiplexer 204 forwards one of the HPM output signal 210-1 or the LPM output signal 210-2 as a selected output signal 214 having a selected frequency $f_{sel}$ as an oscillating signal for use by at least part of the integrated circuit 220.

Figure 3:
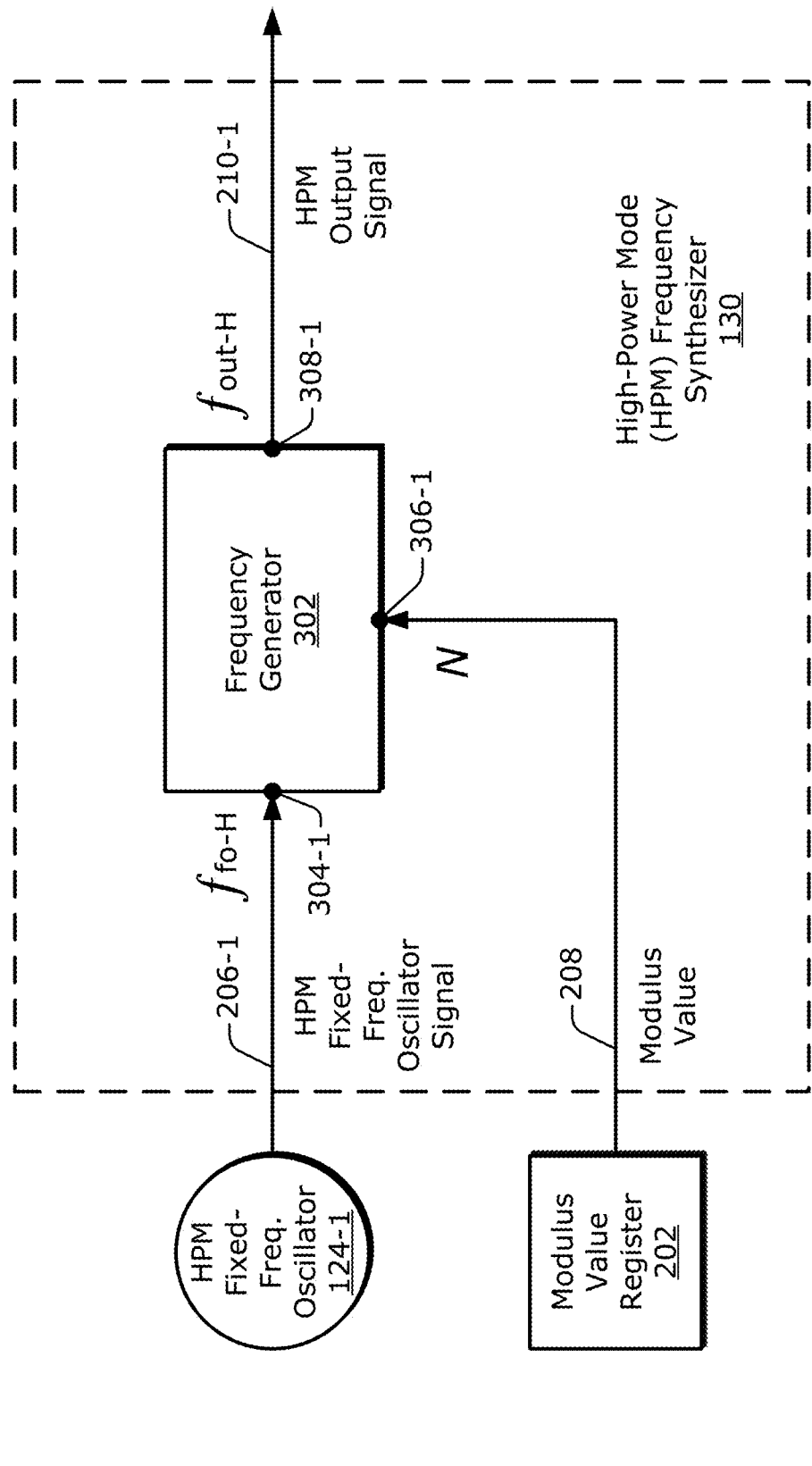
FIG. 3 illustrates an example high-power mode frequency synthesizer that includes a frequency generator.

FIG. 3 illustrates, generally at 300, an example high-power mode frequency synthesizer 130 (HPM frequency synthesizer 130) that includes a frequency generator 302. The HPM frequency synthesizer 130 accepts as input the HPM fixed-frequency oscillator signal 206-1 from the HPM fixed-frequency oscillator 124-1 and forwards the signal to an input 304-1 of the frequency generator 302. The HPM frequency synthesizer 130 also accepts as a control input the modulus value 208 from the modulus value register 202 and forwards the value to a control input 306-1 of the frequency generator 302. The HPM frequency synthesizer 130 provides as output the HPM output signal 210-1 via an output 308-1 of the frequency generator 302. Thus, in example implementations for the HPM frequency synthesizer 130, the frequency generator 302 receives the HPM fixed-frequency oscillator signal 206-1 and the modulus value 208 and produces the HPM output signal 210-1 based thereon.

The frequency generator 302 can be realized using, for example, a PLL, an FLL, or a delay-locked loop (DLL). A PLL can generate a desired frequency by locking onto a phase of a reference signal. An FLL can be used to generate a signal having a specified frequency, or a harmonic thereof, by locking onto a frequency of a reference signal. The frequency generator 302 can therefore be implemented as an analog PLL, a digital PLL, an analog FLL, a digital FLL, and so forth.

In operation, the HPM fixed-frequency oscillator signal 206-1 has the HPM fixed oscillator frequency $f_{fo\text{-}H}$. The frequency generator 302 generates the HPM output signal 210-1 having the HPM output frequency $f_{out\text{-}H}$ based on the HPM fixed oscillator frequency $f_{fo\text{-}H}$ of the HPM fixed-frequency oscillator signal 206-1 and the modulus value 208. For example, the HPM output frequency $f_{out\text{-}H}$ of the HPM output signal 210-1 can be related to a product of the HPM fixed oscillator frequency $f_{fo\text{-}H}$ and the modulus value 208 (N), such as by being approximately equal to this product.

Figure 4:
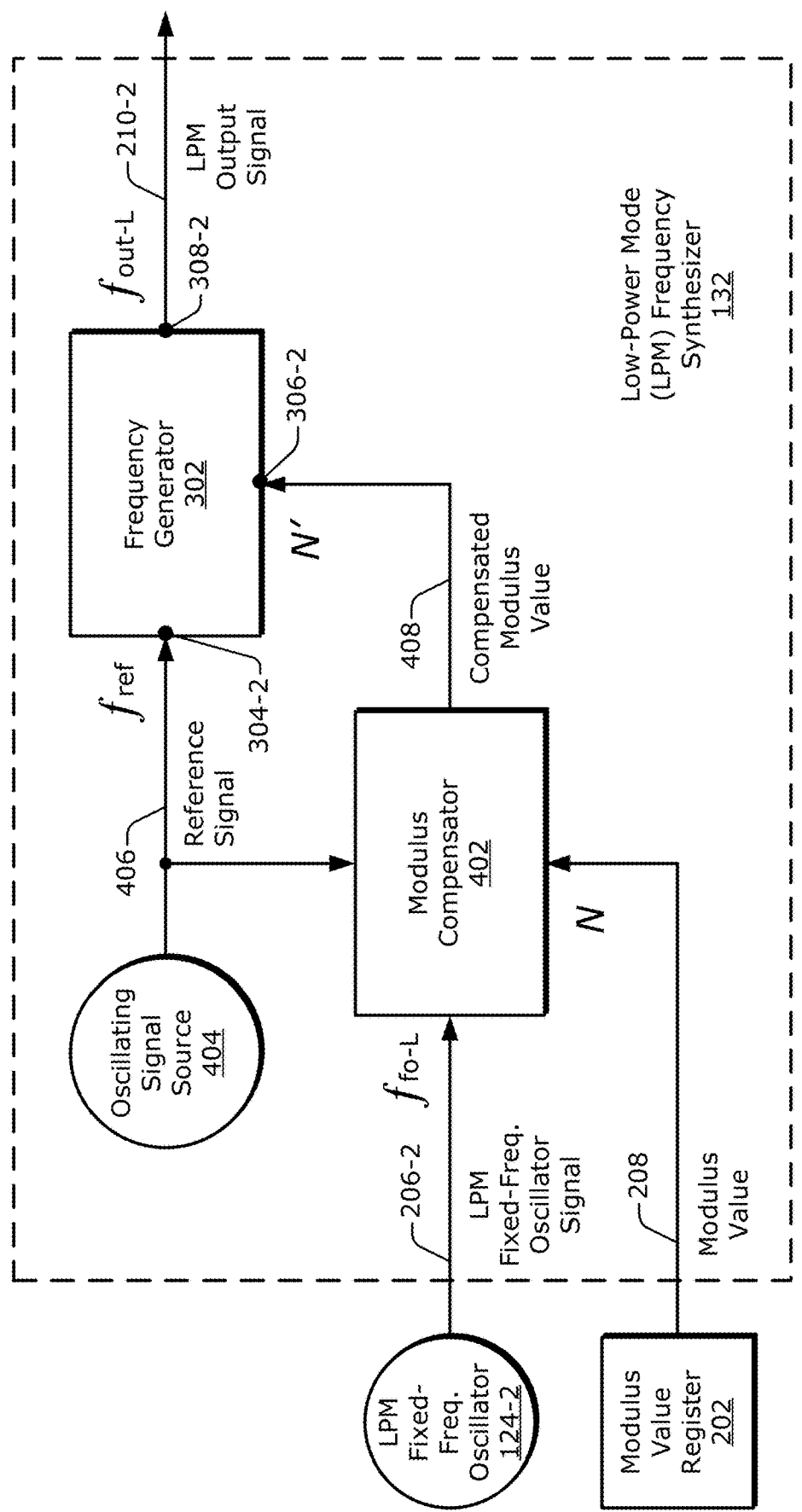
FIG. 4 illustrates an example low-power mode frequency synthesizer that includes a frequency generator, an oscillating signal source, and a modulus compensator, which can jointly implement frequency synthesis with accelerated locking.

FIG. 4 illustrates, generally at 400, an example low-power mode frequency synthesizer 132 (LPM frequency synthesizer 132) that includes a frequency generator 302, a modulus compensator 402, and an oscillating signal source 404, which can jointly implement frequency synthesis with accelerated locking. The LPM frequency synthesizer 132 accepts as input the LPM fixed-frequency oscillator signal 206-2 from the LPM fixed-frequency oscillator 124-2 and the modulus value 208 from the modulus value register 202. The LPM frequency synthesizer 132 provides as output the LPM output signal 210-2. In example implementations for the LPM frequency synthesizer 132, the frequency generator 302 produces the LPM output signal 210-2 based on the LPM fixed-frequency oscillator signal 206-2 and the modulus value 208 (N) using a reference signal 406 and a compensated modulus value 408 (N'), as is described below.

As illustrated, the LPM fixed-frequency oscillator 124-2 and the modulus value register 202 are coupled to the modulus compensator 402. The oscillating signal source 404 is coupled to the frequency generator 302 and the modulus compensator 402. The modulus compensator 402 is also coupled to the frequency generator 302. Generally, the oscillating signal source 404 provides the reference signal 406 having a reference frequency $f_{ref}$. The modulus compensator 402 produces the compensated modulus value 408 (N'). The HPM frequency synthesizer 130 (e.g., of FIG. 3) and the LPM frequency synthesizer 132 can each include a separate or independent frequency generator 302. Alternatively, one frequency generator 302 can be shared between the HPM frequency synthesizer 130 and the LPM frequency synthesizer 132 using appropriate switching circuitry (not shown).

In some implementations, the oscillating signal source 404 is realized using a non-fixed-frequency oscillator, an oscillator having an output that varies based on operational or environmental parameters (e.g., PVT characteristics), a voltage-based oscillator, a ring oscillator, some combination thereof, and so forth. For instance, the oscillating signal source 404 can be implemented using at least one ring oscillator having a rate of oscillation that is dependent on a supplied voltage. The oscillation frequency can range, for example, from the single-digit megahertz (MHz) to the triple-digit MHz, such as approximately 200 MHz. Thus, the oscillating signal source 404 can produce a reference signal having a reference frequency that is less stable than the LPM fixed oscillator frequency $f_{fo\text{-}L}$ that is produced by the LPM fixed-frequency oscillator 124-2, which can be implemented with, e.g., a crystal oscillator.

In an example operation, the oscillating signal source 404 produces the reference signal 406 having the reference frequency $f_{ref}$. The oscillating signal source 404 provides the reference signal 406, including a version thereof, to a first input 304-2 of the frequency generator 302 and to the modulus compensator 402. The modulus compensator 402 receives the reference signal 406, the LPM fixed-frequency oscillator signal 206-2 having the LPM fixed oscillator frequency $f_{fo\text{-}L}$, and the modulus value 208 (N). Based on these three parameters, the modulus compensator 402 produces a compensated modulus value 408 (N') to account for at least one difference between the frequencies of the reference signal 406 and the LPM fixed-frequency oscillator signal 206-2, as is described further below with reference to FIGS. 5 and 6.

For example, the modulus compensator 402 can be configured to produce the compensated modulus value 408 (N') such that a relationship between the compensated modulus value 408 (N') and a version of the reference frequency $f_{ref}$ that is provided to the frequency generator 302 is substantially similar (e.g., equivalent within the capabilities of the circuitry and the employed number of digital bits, if any) to another relationship between the modulus value 208 (N) and a LPM fixed oscillator frequency $f_{fo\text{-}L}$. Thus, the modulus compensator 402 provides a compensation mechanism for producing a compensated modulus value 408 (N') to compensate for a difference between a LPM fixed oscillator frequency $f_{fo\text{-}L}$ of a LPM fixed-frequency oscillator signal 206-2 and a reference frequency $f_{ref}$ of a reference signal 406. The modulus compensator 402 provides the compensated modulus value 408 (N') to the frequency generator 302 at a control input 306-2 thereof.

The frequency generator 302 therefore receives the reference signal 406 having the reference frequency $f_{ref}$ at the input 304-2 and the compensated modulus value 408 (N') at the control input 306-2. Based on these two parameters, the frequency generator 302 generates at an output 308-2 the LPM output signal 210-2 having the LPM output frequency $f_{out-L}$. Thus, the frequency generator 302 provides a frequency generation mechanism for generating a LPM output signal 210-2 with a LPM output frequency $f_{out-L}$ based on a reference signal 406 and a compensated modulus value 408 (N').

In some implementations, the modulus compensator 402 can produce the compensated modulus value 408 (N') such that the frequency generator 302 generates a frequency for the LPM output frequency $f_{out-L}$ using the reference signal 406 that would be output by a frequency generator that "directly" receives the LPM fixed-frequency oscillator signal 206-2 having the LPM fixed oscillator frequency $f_{fo-L}$ and the modulus value 208 (N). Doing so enables the reference frequency $f_{ref}$ that is applied to the input 304-2 to be significantly higher than the LPM fixed oscillator frequency $f_{fo-L}$, and this enables a locking duration that extends to approximately 100 cycles of an input signal to elapse significantly more quickly. Consequently, the frequency generator 302 can lock to an input reference signal faster, and repeated standby periods cause less of a negative impact on an electronic device. To account for changing conditions (e.g., temperature or voltage fluctuations), the modulus compensator 402 can update the compensated modulus value 408 (N') repeatedly (e.g., regularly, continuously, continually, repeatedly at a constant interval, or repeatedly at varying intervals) in the background during operation of an electronic device or component thereof, such as a wireless transceiver.

The LPM frequency synthesizer 132 can operate with integer, fractional, or combined integer and fractional moduli, in various modes (e.g., an integer mode, a fractional mode, or a combined integer-plus-fractional mode). Accordingly, the modulus value 208 (N) can comprise at least one of an integer modulus value or a fractional modulus value (which can include an integer and fractional combination modulus value). Similarly, the compensated modulus value 408 (N') can comprise at least one of a compensated integer modulus value or a compensated fractional modulus value (which can include an integer and fractional combination compensated modulus value). To accommodate these different types of moduli, the frequency generator 302 can operate with at least one of the compensated integer modulus value or the compensated fractional modulus value.

Figure 5:
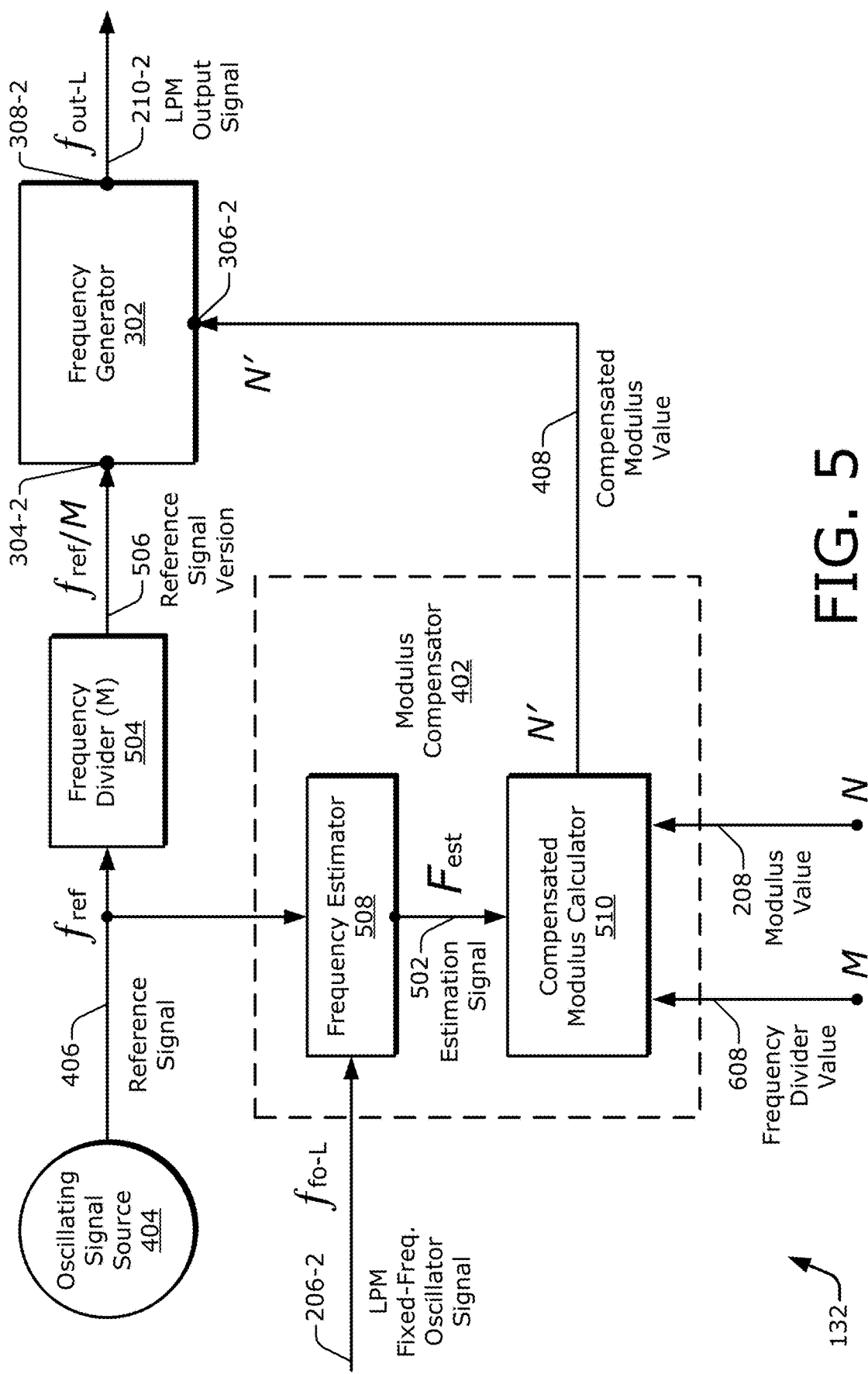
FIG. 5 illustrates an example low-power mode frequency synthesizer having a frequency divider and an example modulus compensator, with the modulus compensator including a frequency estimator and a compensated modulus calculator.

FIG. 5 illustrates an example LPM frequency synthesizer 132 with a frequency divider 504 and an example modulus compensator 402. The modulus compensator 402 includes a frequency estimator 508 and a compensated modulus calculator 510. As illustrated, the oscillating signal source 404 is coupled to the frequency divider 504, and the frequency divider 504 is coupled to the frequency generator 302. Thus, the oscillating signal source 404 can be coupled to the frequency generator 302 via a frequency divider 504, as shown in FIG. 5. The oscillating signal source 404 is also coupled to the frequency estimator 508, which is coupled to the compensated modulus calculator 510. The compensated modulus calculator 510 of the modulus compensator 402 is coupled to the frequency generator 302.

In some implementations, the frequency divider 504, with a frequency divider value (M), can modify a reference frequency $f_{ref}$ of the reference signal 406 while coupled between the oscillating signal source 404 and the frequency generator 302. Based on this frequency modification, the frequency divider 504 provides a version of the reference signal 506 (reference signal version 506) to the frequency generator 302. For instance, the frequency divider 504 can provide a divided version of the reference signal 406, such as a frequency-lowered version of the reference signal 406, as represented by "$f_{ref}/M$" in FIG. 5. Here, the variable M is representative of a positive number, such as a positive integer of one or greater. Thus, in this example, the frequency generator 302 receives at the input 304-2 a version of the reference signal 506 having a version of the reference frequency ($f_{ref}/M$).

The frequency estimator 508, on the other hand, receives the reference signal 406 having the reference frequency $f_{ref}$ and the LPM fixed-frequency oscillator signal 206-2 having the LPM fixed oscillator frequency $f_{fo-L}$. In an example operation, the frequency estimator 508 estimates a frequency of the less-predictable reference frequency $f_{ref}$ using the more-predictable LPM fixed oscillator frequency $f_{fo-L}$ of the LPM fixed-frequency oscillator signal 206-2. Thus, the frequency estimator 508 generates an estimation signal 502 indicative of an estimated frequency $F_{est}$ of the reference signal 406 based on the reference frequency $f_{ref}$ and the LPM fixed oscillator frequency $f_{fo-L}$, which estimation is described with reference to FIG. 6. In these manners, the frequency estimator 508 provides an estimation mechanism for estimating a reference frequency $f_{ref}$ of a reference signal 406 to produce an estimated frequency $F_{est}$ using the LPM fixed oscillator frequency $f_{fo-L}$ of the LPM fixed-frequency oscillator signal 206-2. The higher frequency of the reference frequency $f_{ref}$ relative to the lower frequency of the LPM fixed oscillator frequency $f_{fo-L}$ results in a lower percentage of error for the estimation because many cycles of the former occur within a single period of the latter. Although the reference signal version 506 or a reference signal 406 with a lower frequency can be provided to the frequency estimator 508, the resulting percentage error will be higher.

Figure 6:
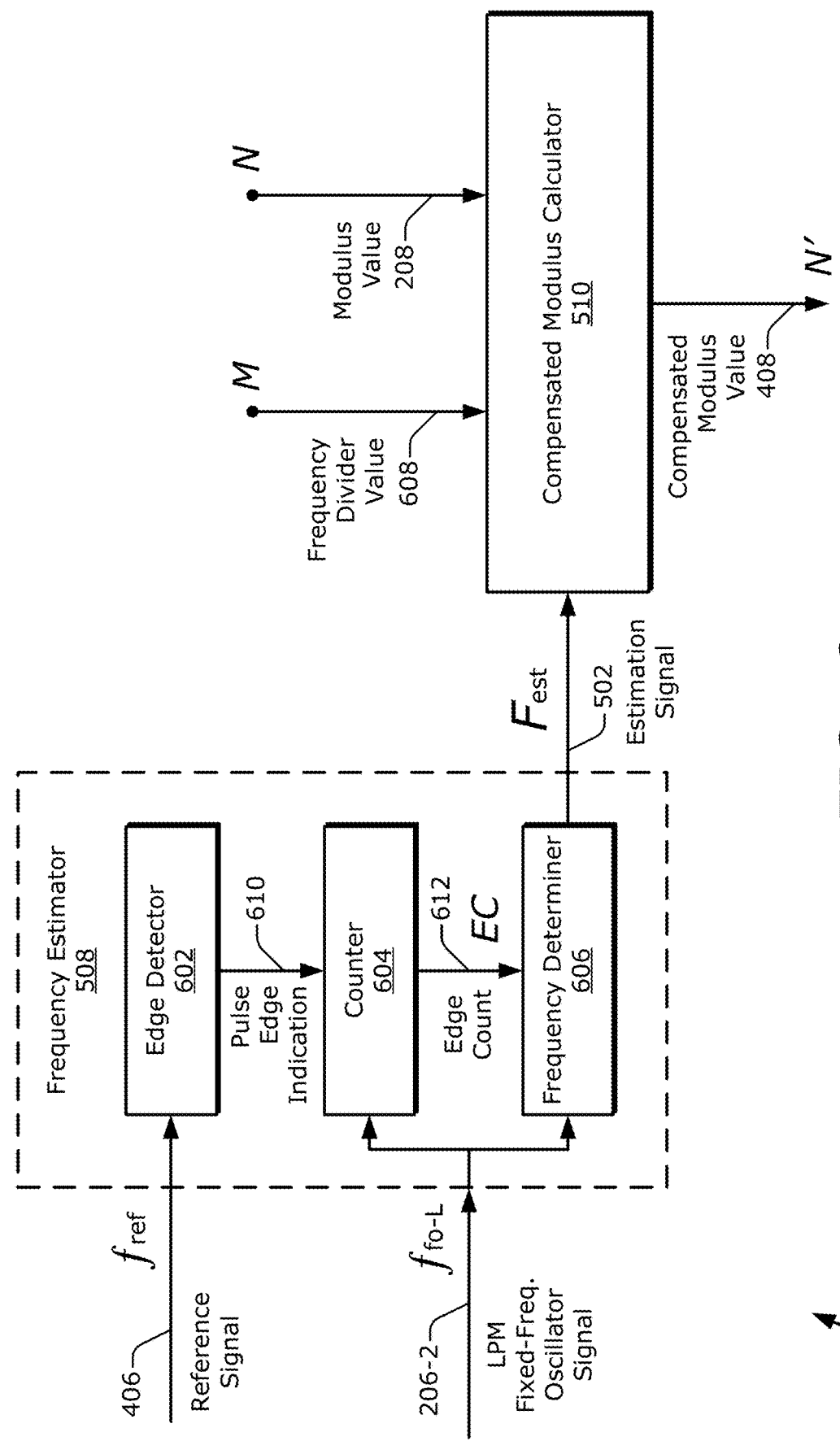
FIG. 6 illustrates an example frequency estimator and an example compensated modulus calculator that are jointly configured to implement frequency synthesis with accelerated locking.

The frequency estimator 508 provides the estimation signal 502 ($F_{est}$), which may comprises a digital signal, to the compensated modulus calculator 510. The compensated modulus calculator 510 therefore receives at least the estimation signal 502 ($F_{est}$) and the modulus value 208 (N). Based on the estimated frequency $F_{est}$ as indicated by the estimation signal 502 and the modulus value 208 (N), the compensated modulus calculator 510 computes the compensated modulus value 408 (N'), which calculation is described below with reference to FIG. 6. As shown in FIGS. 5 and 6, the compensated modulus calculator 510 can also obtain the frequency divider value M for this calculation. Responsive to this calculation, the compensated modulus calculator 510 provides the compensated modulus value 408 (N') to the control input 306-2 of the frequency generator 302.

FIG. 6 illustrates an example frequency estimator 508 and an example compensated modulus calculator 510 that are jointly configured as a modulus compensator 402 to implement frequency synthesis with accelerated locking. As illustrated, the frequency estimator 508 includes an edge detector 602, a counter 604, and a frequency determiner 606. The edge detector 602 is coupled to the oscillating signal source 404 (of FIGS. 4 and 5) and the counter 604. In addition to the edge detector 602, the counter 604 is coupled to the LPM fixed-frequency oscillator 124-2 (of FIG. 4) and the frequency determiner 606. In addition to the counter 604, the frequency determiner 606 is coupled to the LPM fixed-frequency oscillator 124-2 (of FIG. 4) and the compensated modulus calculator 510.

In example implementations, the edge detector 602 receives the reference signal 406 and detects pulse edges of the reference signal 406 to provide a pulse edge indication 610 to the counter 604, such as one indication per cycle of the reference frequency $f_{ref}$. The counter 604 counts the indications of the detected pulse edges and produces an edge count 612 (EC) for each cycle of the LPM fixed-frequency oscillator signal 206-2 at the LPM fixed oscillator frequency $f_{fo-L}$. The counter 604 also provides the detected edge count 612 (EC) to the frequency determiner 606. The frequency determiner 606 receives the edge count 612 (EC) and the LPM fixed-frequency oscillator signal 206-2. The frequency determiner 606 determines the estimation signal 502 that is indicative of the estimated frequency $F_{est}$, which is an estimation of the reference frequency $f_{ref}$ of the reference signal 406, based on the edge count 612 and the LPM fixed-frequency oscillator signal 206-2. In some implementations, the estimated frequency $F_{est}$ is stored in a register or counter that is part of the frequency determiner 606 or the compensated modulus calculator 510. In these manners, the edge detector 602 provides a detection mechanism for detecting pulse edges of the reference signal 406, and the frequency determiner 606 provides a determination mechanism for determining the estimated frequency $F_{est}$ using an edge count 612 that is responsive to the detected pulse edges corresponding to the pulse edge indication 610.

By way of example, the frequency determiner 606 can be implemented as a divider. If so, the divider can determine the estimated frequency $F_{est}$ of the estimation signal 502 by dividing the LPM fixed oscillator frequency $f_{fo-L}$ of the LPM fixed-frequency oscillator signal 206-2 by a reciprocal of the edge count 612 (e.g., or by multiplying the LPM fixed oscillator frequency $f_{fo-L}$ by the edge count 612) that is accumulated during one period of the LPM fixed-frequency oscillator signal 206-2. This determination can be made, and the estimated frequency $F_{est}$ can be updated, as frequently as once each cycle of the LPM fixed-frequency oscillator signal 206-2. However, the updates can occur less frequently.

As the reference frequency $f_{ref}$ increases, the size of the edge count 612 per period of the LPM fixed-frequency oscillator signal 206-2 likewise increases, and this lowers the error percentage should a pulse edge or two fail to be counted in a given period. Further, due to the operation of the frequency estimator 508, the estimated frequency $F_{est}$ is based on the relatively stable, predictable, and precise LPM fixed oscillator frequency $f_{fo-L}$ of the LPM fixed-frequency oscillator signal 206-2 instead of on the relatively unstable, unpredictable, and variable reference frequency $f_{ref}$ of the reference signal 406. As shown, this estimated frequency $F_{est}$ is provided to the compensated modulus calculator 510 as the estimation signal 502.

In some implementations, the compensated modulus calculator 510 therefore receives a digital value via the estimation signal 502, with the digital value indicative of the estimated frequency $F_{est}$ (e.g., an estimate of the reference frequency $f_{ref}$ of the reference signal 406). The compensated modulus calculator 510 further obtains one or more other values to compute the compensated modulus value 408 (N'). As shown, the compensated modulus calculator 510 also receives a frequency divider value 608 (M) and the modulus value 208 (N). The frequency divider value 608 (M) corresponds to the frequency divider value M that is used by the frequency divider 504 (of FIG. 5). The frequency divider value 608 can be hard-wired into the compensated modulus calculator 510 or can be obtained from another component, such as the frequency divider 504 or a controller or register thereof.

Thus, the compensated modulus calculator 510 has access to the estimated frequency $F_{est}$ as indicated by the estimation signal 502, the frequency divider value 608 (M), and the modulus value 208 (N). In operation, the compensated modulus calculator 510 can compute the compensated modulus value 408 (N') based on the estimated frequency $F_{est}$, the frequency divider value M, and the modulus value N. The modulus compensator 402 is implemented to compensate for the higher frequency of the oscillating signal source 404 while still providing a target output frequency expected by a downstream component or device that is to use the output frequency provided by a LPM frequency synthesizer 132 (e.g., of FIG. 4) given that the frequency is to be synthesized using the frequency generator 302.

To match the target output frequency the user is expecting, the modulus compensator 402 is configured to compute the compensated modulus value 408 (N') such that:

$$f_{fo-L} * N = (F_{est}/M) * N', \quad (1)$$

where the first half of Equation (1) represents the expectation of a downstream component (and a designer of an electronic device) based on externally-apparent settings and values for a LPM frequency synthesizer 132 and the second half of the Equation (1) represents the internal settings and values implemented by the LPM frequency synthesizer 132 that employs an oscillating signal source 404 (e.g., of FIG. 5). Solving for the compensated modulus value 408 (N'), yields Equation (2):

$$N' = \frac{f_{fo-L} * N * M}{F_{est}}. \quad (2)$$

The modulus compensator 402 can therefore compute the compensated modulus value 408 (N') that results in a LPM output signal 210-2 having an expected LPM output frequency $f_{out-L}$ of approximately $f_{fo-L}*/V$, while still being able to lock using a quantity of cycles that occur at a faster rate, such as at a version of the reference frequency $f_{ref}$.

Generally, the frequency estimator 508 and the compensated modulus calculator 510 of the modulus compensator 402 can operate on analog or digital values or signals. For example, the estimation signal 502 ($F_{est}$) can comprise a digital representation of an estimation of the reference frequency $f_{ref}$ of the reference signal 406. The estimated frequency $F_{est}$ may be stored in the form of a counter (e.g., a frequency counter value (FCV)). Thus, the frequency determiner 606 or the compensated modulus calculator 510 can include a counter (not separately shown) that holds a digital value of the estimated frequency $F_{est}$ that is indicative of the reference frequency $f_{ref}$ of the reference signal 406. To realize this digital representation, the following example technique can be implemented:

The counter 604 counts edges of the reference signal 406 ($f_{ref}$ pulses) against the LPM fixed-frequency oscillator signal 206-2 ($f_{fo-L}$ pulses), or vice-versa. This provides an estimate of a ratio between $f_{ref}$ and $f_{fo-L}$. This ratio is equal to ($f_{ref}/f_{fo-L}$), and the edge count 612 (EC) approximates this ratio.

The frequency determiner 606 therefore operates using the digital value of the edge count 612 (EC) to produce the estimation signal 502 ($F_{est}$) as a digital frequency counter value (FCV) as follows: estimated frequency $F_{est}=f_{fo-L}*EC$. The FCV is therefore approximately the reference frequency $f_{ref}$. The LPM fixed oscillator frequency $f_{fo-L}$ can be set by a designer or provided manually, so it has a known value.

The modulus compensator 402 determines the compensated modulus value 408 (N')=N*M*$f_{fo-L}$/$F_{est}$. As indicated above, $F_{est}$=$f_{fo-L}$*EC. By substitution, N'=M*N/EC. In this manner, the LPM fixed oscillator frequency $f_{fo-L}$ is canceled out of the mathematical formula for the compensated modulus value 408 (N') that is used by the compensated modulus calculator 510. Thus, the circuitry can store the digital value of the edge count 612 (EC) as the frequency estimation $F_{est}$ to compute N'. In such cases, the digital value of the frequency estimation $F_{est}$ of the estimation signal 502 comprises the edge count 612 (EC).

In alternative implementations, the $f_{fo-L}$ pulses of the LPM fixed-frequency oscillator signal 206-2 may be counted against those of the reference frequency $f_{ref}$ of the reference signal 406. In this case, a reciprocal of the edge counter is substituted in the equations above.

Figure 7:
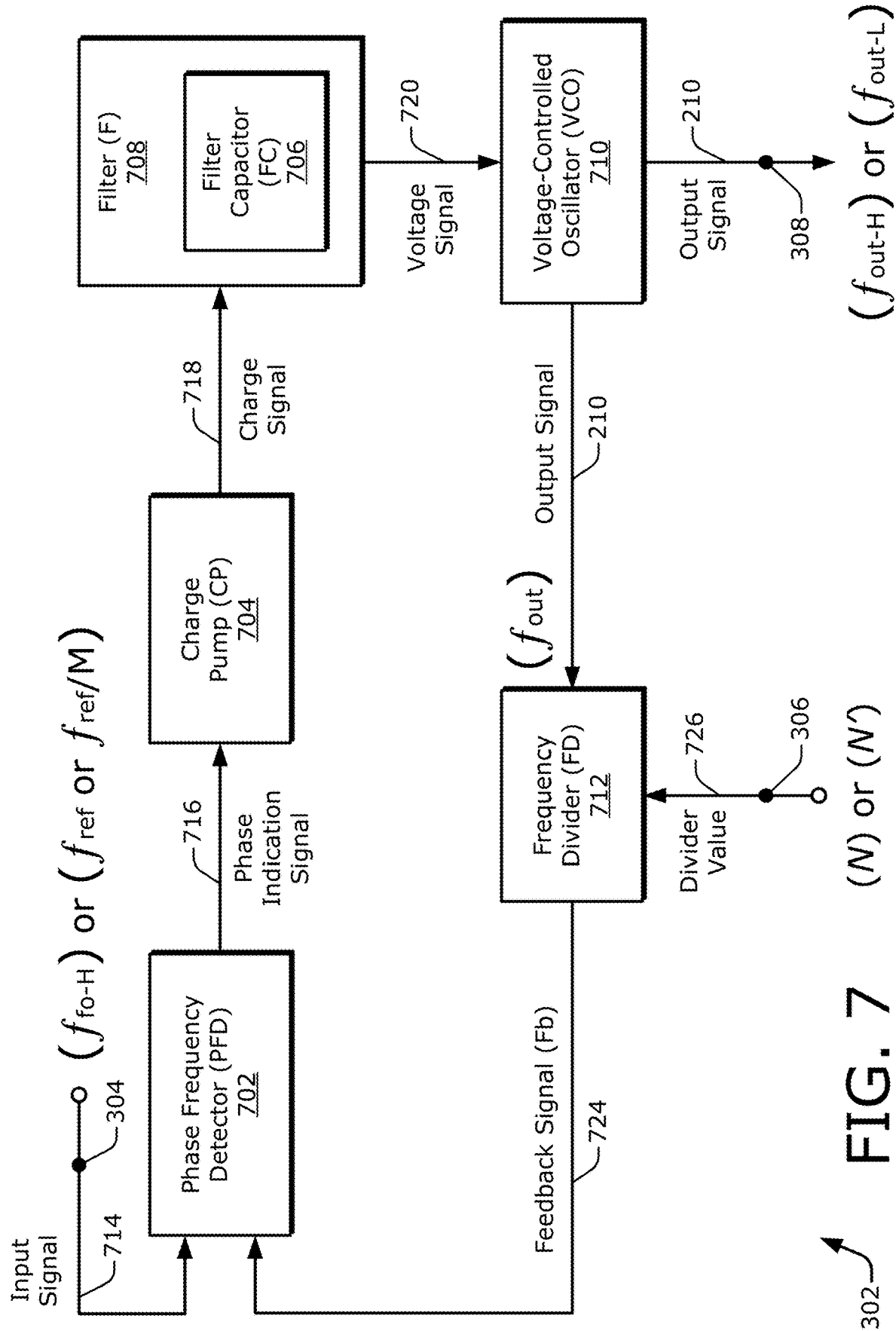
FIG. 7 illustrates an example frequency generator that is realized as a phase-locked loop (PLL).

FIG. 7 illustrates an example frequency generator 302 that is realized as a phase-locked loop (PLL). As shown, the example PLL-based frequency generator 302 includes a phase frequency detector 702 (PFD), a charge pump 704 (CP), a filter 708 (F) having a filter capacitor 706 (FC), a voltage-controlled oscillator 710 (VCO), and a frequency divider 712 (FD). Although these example implementations of a frequency generator 302 are described in terms of an analog PLL, the principles of frequency synthesis with accelerated locking as described herein are applicable to other types of frequency generators, such as a digital PLL or an FLL. The example frequency generator 302 can be implemented as part of a HPM frequency synthesizer 130 or as part of a LPM frequency synthesizer 132 (e.g., both of FIGS. 1 and 2). Further, by interpreting the "or" as an inclusive disjunction as explained hereinbelow, respective instances of the example frequency generator 302 can be implemented as part of a HPM frequency synthesizer 130 and as part of a LPM frequency synthesizer 132.

With reference also to FIGS. 3-5, certain example inputs and outputs are indicated in FIG. 7 that map to the example HPM frequency synthesizer 130 and the example LPM frequency synthesizer 132 that are described above. Specifically, an input 304, a control input 306, and an output 308 are indicated. The input 304 can accept an input signal 714. Examples of the input signal 714 include a HPM fixed-frequency oscillator signal 206-1 with a HPM fixed oscillator frequency $f_{fo-H}$ for a HPM frequency synthesizer 130 (as shown in FIG. 3), a reference signal 406 with a reference frequency $f_{ref}$ for a LPM frequency synthesizer 132 (as shown in FIG. 4), and a version of the reference signal 506 with a version of the reference frequency $f_{ref}$/M for a LPM frequency synthesizer 132 (as shown in FIG. 5). The control input 306 can accept a divider value 726. Examples of the divider value 726 include a modulus value 208 (N) for a HPM frequency synthesizer 130 (as shown in FIG. 3) and a compensated modulus value 408 (N') for a LPM frequency synthesizer 132 (as shown in FIGS. 5 and 6). The output 308 can provide an output signal 210. Examples of the output signal 210 include a HPM output signal 210-1 with a HPM output frequency f out-H produced by a HPM frequency synthesizer 130 (as shown in FIG. 3) and a LPM output signal 210-2 with a LPM output frequency $f_{out-L}$ produced by a LPM frequency synthesizer 132 (as shown in FIGS. 4 and 5).

As shown, the phase frequency detector 702 is coupled to the charge pump 704, and the charge pump 704 is coupled to the filter 708. The filter 708 is coupled to the voltage-controlled oscillator 710, and the voltage-controlled oscillator 710 is coupled to the frequency divider 712. To close or complete a signal propagation path of a feedback loop of the PLL, the frequency divider 712 is coupled to the phase frequency detector 702.

In example implementations, the PLL of the frequency generator 302 utilizes a negative feedback path as part of a signal propagation loop. The following description of a feedback loop of the PLL starts at the top-left corner of FIG. 7 at the phase frequency detector 702 and continues in a clockwise direction. The phase frequency detector 702 receives the input signal 714 and a feedback signal 724 (Fb). From the phase frequency detector 702, signal flow of the PLL continues to the charge pump 704. From the charge pump 704, the signal flow extends to the filter 708, and the filter 708 provides a control signal to the voltage-controlled oscillator 710. The voltage-controlled oscillator 710 produces the output signal 210 based on this control signal. The output signal 210 is also fed back to the phase frequency detector 702, via the frequency divider 712, as part of the feedback path of the PLL of the frequency generator 302 that includes the feedback signal 724.

In an example operation, the phase frequency detector 702 produces a phase indication signal 716 based on a phase difference between the input signal 714 and the feedback signal 724. The charge pump 704 receives the phase indication signal 716, which is indicative of the phase difference, and converts the phase indication signal 716 to a charge signal 718. The charge pump 704 provides the charge signal 718 to the filter 708. Thus, the charge from the charge signal 718 is applied to the filter capacitor 706 of the filter 708. This applied charge can increase or decrease a voltage level associated with the filter capacitor 706. The voltage level of the filter capacitor 706 can serve as a voltage signal 720. In effect, the filter 708 uses the filter capacitor 706 to integrate the charge signal 718 by charging the filter capacitor 706 (e.g., in which charging can include adding charge to or removing charge from the filter capacitor 706). The filter 708 can also perform lowpass filtering as part of the operation to generate the voltage signal 720.

The filter 708 provides the voltage signal 720 to the voltage-controlled oscillator 710. The voltage-controlled oscillator 710 functions as an oscillator having a frequency that is proportional to a magnitude of the voltage signal 720. Hence, the voltage-controlled oscillator 710 produces an oscillating signal as the output signal 210 based on the voltage signal 720 obtained from the filter 708. Thus, this oscillating signal can represent the output signal 210 of the PLL of the example frequency generator 302. This oscillating signal is also used to continue the feedback loop of the PLL. Accordingly, the output signal 210 can be fed directly back to the phase frequency detector 702 without modification (e.g., where the feedback signal 724 comprises an unmodified version of the output signal 210). However, as illustrated in FIG. 7, the voltage-controlled oscillator 710 can instead provide the output signal 210 to the frequency divider 712. The frequency divider 712 generates the feedback signal 724 based on the output signal 210 and the frequency divider value 726, which can be fixed or adjustable. The frequency divider 712 provides the feedback signal 724 to the phase frequency detector 702 to complete the feedback loop of the PLL of the frequency generator 302.

Figure 8:
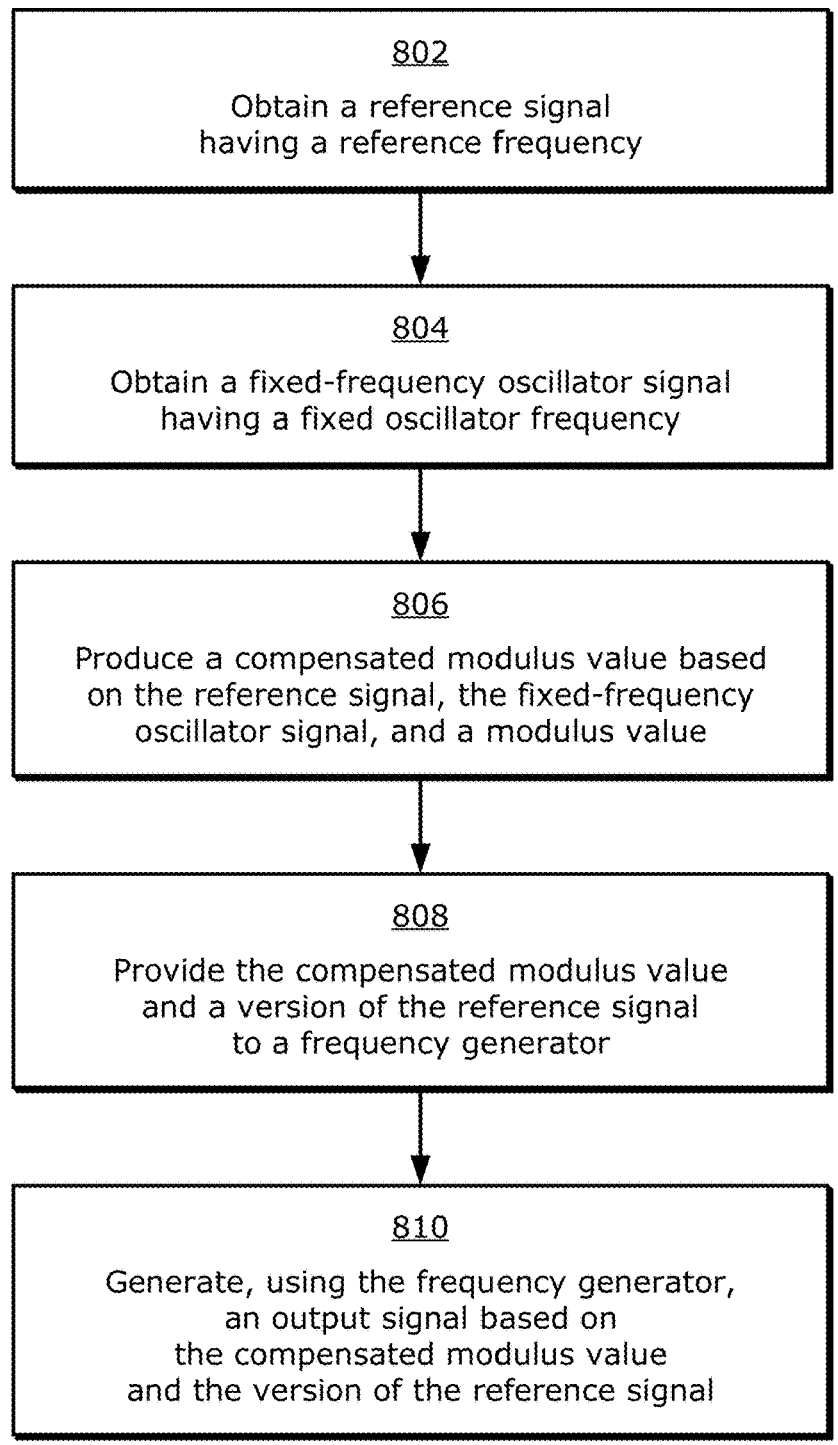
FIG. 8 is a flow diagram illustrating an example process for frequency synthesis with accelerated locking.

FIG. 8 is a flow diagram illustrating an example process 800 for frequency synthesis with accelerated locking. The process 800 is described in the form of a set of blocks 802-810 that specify operations that can be performed. However, operations are not necessarily limited to the order shown in FIG. 8 or described herein, for the operations may be implemented in alternative orders or in fully or partially overlapping manners. Operations represented by the illustrated blocks of the process 800 may be performed by a frequency synthesizer, such as at least partially by a LPM frequency synthesizer 132. More specifically, the operations of the process 800 may be performed by an oscillating signal source 404, a modulus compensator 402, and a frequency generator 302 (e.g., of FIG. 4).

At block 802, a reference signal having a reference frequency is obtained. For example, circuitry can obtain a reference signal 406 having a reference frequency $f_{ref}$ from the oscillating signal source 404. The oscillating signal source 404 may be implemented with a voltage-based ring oscillator, which produces a variable frequency that depends on environmental parameters.

At block 804, a fixed-frequency oscillator signal having a fixed oscillator frequency is obtained. For example, the modulus compensator 402 can obtain a LPM fixed-frequency oscillator signal 206-2 with a LPM fixed oscillator frequency $f_{fo-L}$. A LPM fixed-frequency oscillator 124-2 may provide the LPM fixed-frequency oscillator signal 206-2, with the LPM fixed-frequency oscillator 124-2 located on a same or a different chip from the modulus compensator 402 or the frequency generator 302. In an example crystal oscillator implementation, the LPM fixed-frequency oscillator 124-2 is configured to vibrate at the LPM fixed oscillator frequency $f_{fo-L}$ in a stable and consistent manner to produce the LPM fixed-frequency oscillator signal 206-2.

At block 806, a compensated modulus value is produced based on the reference signal, the fixed-frequency oscillator signal, and a modulus value. For example, the modulus compensator 402 can produce a compensated modulus value 408 (N') based on the reference signal 406, the LPM fixed-frequency oscillator signal 206-2, and a modulus value 208 (N). For instance, the modulus compensator 402 may compute the compensated modulus value 408 (N') using the reference frequency $f_{ref}$, the LPM fixed oscillator frequency $f_{fo-L}$, and the modulus value 208 (N), which may be provided by a system designer or other user.

At block 808, the compensated modulus value and a version of the reference signal are provided to a frequency generator. For example, circuitry can route the compensated modulus value 408 (N') and a version of the reference signal 506 to a frequency generator 302. To do so, the compensated modulus calculator 510 may provide the compensated modulus value 408 (N') to the frequency generator 302. Additionally, the reference signal 406 may be routed through a frequency divider 504 having a fixed or adjustable frequency divider value M on a path between the oscillating signal source 404 and the frequency generator 302 to provide the version of the reference signal 506 with a version of the reference frequency ($f_{ref}$/M).

At block 810, an output signal is generated using the frequency generator and based on the compensated modulus value and the version of the reference signal. For example, the frequency generator 302 can generate a LPM output signal 210-2 based on the compensated modulus value 408 (N') and the version of the reference signal 506. The frequency generator 302 may implement a locked loop that multiplies the version of the reference frequency ($f_{ref}$/M) by the compensated modulus value 408 (N') to generate the LPM output signal 210-2 having a LPM output frequency $f_{out-L}$.

Figure 9:
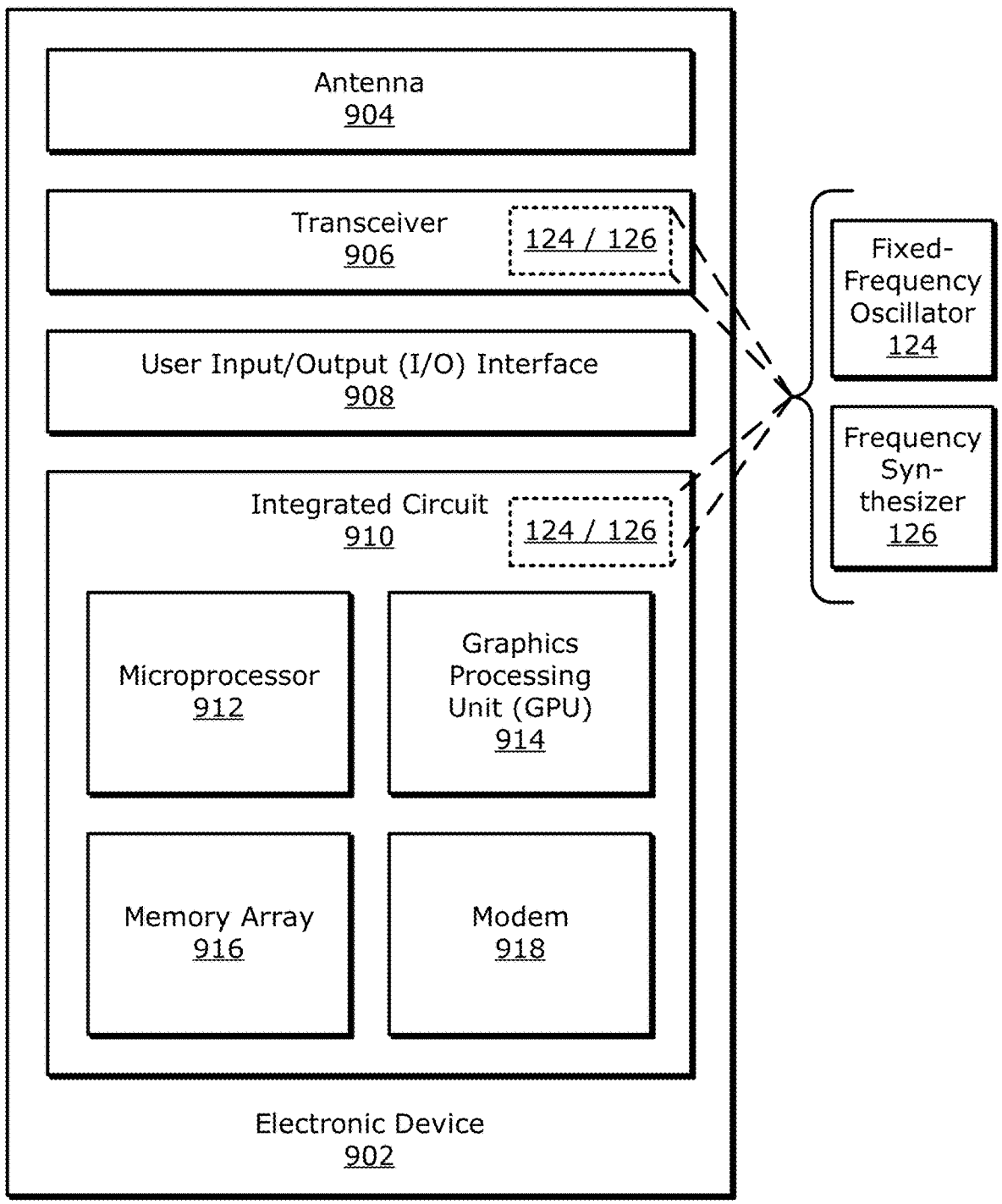
FIG. 9 illustrates an example electronic device that includes one or more components in which frequency synthesis with accelerated locking can be implemented.

FIG. 9 illustrates an example electronic device 902 that includes an integrated circuit 910 (IC) having multiple cores. The electronic device 902 includes one or more components in which frequency synthesis with accelerated locking can be implemented. As shown, the electronic device 902 includes an antenna 904, a transceiver 906, and a user input/output (I/O) interface 908, in addition to the integrated circuit 910. Illustrated examples of the integrated circuit 910, or cores thereof, include a microprocessor 912, a graphics processing unit 914 (GPU), a memory array 916, and a modem 918. In one or more example implementations, a fixed-frequency oscillator 124 and a frequency synthesizer 126 as described herein can be implemented with or by the transceiver 906, with or by the integrated circuit 910, and so forth such that frequency synthesis with accelerated locking can be realized, including in various power management scenarios.

The electronic device 902 can be a mobile or battery-powered device or a fixed device that is designed to be powered by an electrical grid. Examples of the electronic device 902 include a server computer, a network switch or router, a blade of a data center, a personal computer, a desktop computer, a notebook or laptop computer, a tablet computer, a smart phone, an entertainment appliance, a security device, an Internet of Things (IoT) device, and a wearable computing device such as a smartwatch, intelligent glasses, or an article of clothing. An electronic device 902 can also be a device, or a portion thereof, having embedded electronics. Examples of the electronic device 902 with embedded electronics include a passenger vehicle, wireless charging equipment, industrial equipment, a refrigerator or other home appliance, a drone or other unmanned aerial vehicle (UAV), and a power tool.

For an electronic device with a wireless capability, the electronic device 902 includes an antenna 904 that is coupled to a transceiver 906 to enable reception or transmission of one or more wireless signals. The integrated circuit 910 may be coupled to the transceiver 906 to enable the integrated circuit 910 to have access to received wireless signals or to provide wireless signals for transmission via the antenna 904. The electronic device 902 as shown also includes at least one user I/O interface 908. Examples of the user I/O interface 908 include a keyboard, a mouse, a microphone, a touch-sensitive screen, a camera, an accelerometer, a haptic mechanism, a speaker, a display screen, or a projector. The transceiver 906 can correspond to, for instance, the wireless transceiver 120 (of FIG. 1) that implements a frequency synthesizer 126 (e.g., a LPM frequency synthesizer 132) as described herein.

The integrated circuit 910 may comprise, for example, one or more instances of a microprocessor 912, a GPU 914, a memory array 916, a modem 918, and so forth. The microprocessor 912 may function as a central processing unit (CPU) or other general-purpose processor. Some microprocessors include different parts, such as multiple processing cores, that may be individually powered on or off. The GPU 914 may be especially adapted to process visual-related data for display, such as video data images. If visual-related data is not being rendered or otherwise processed, the GPU 914 may be fully or partially powered down. The memory array 916 stores data for the microprocessor 912 or the GPU 914. Example types of memory for the memory array 916 include random access memory (RAM), such as dynamic RAM (DRAM) or static RAM (SRAM); flash memory; and so forth. If programs are not accessing data stored in memory, the memory array 916 may be powered down overall or block-by-block. The modem 918 demodulates a signal to extract encoded information or modulates a signal to encode information into the signal. If there is no information to decode from an inbound communication or to encode for an outbound communication, the modem 918 may be idled to reduce power consumption. The integrated circuit 910 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 910 may also comprise a system-on-chip (SoC). An SoC may integrate a sufficient number of different types of components to enable the SoC to provide computational functionality as a notebook computer, a mobile phone, or another electronic apparatus using one chip, at least primarily. Components of an SoC, or an integrated circuit 910 generally, may be termed cores or circuit blocks. Examples of cores or circuit blocks include, in addition to those that are illustrated in FIG. 9, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a central processing unit or a multimedia processor, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   an oscillating signal source configured to provide a reference signal having a reference frequency;
   a modulus compensator coupled to the oscillating signal source and configured to receive the reference signal, the modulus compensator:
      comprising a frequency estimator coupled to the oscillating signal source, the frequency estimator configured to produce an estimation signal indicative of an estimated frequency based on the reference signal and a fixed-frequency oscillator signal having a fixed oscillator frequency, the estimated frequency representative of an estimate of the reference frequency of the reference signal; and
      configured to produce a compensated modulus value based on at least one division operation including a modulus value and the estimated frequency; and
   a frequency generator coupled to the oscillating signal source and the modulus compensator and configured to receive the compensated modulus value, the frequency generator configured to generate an output signal having an output frequency that is based on the reference frequency and the compensated modulus value.

2. The apparatus of claim 1, wherein the modulus compensator is configured to produce the compensated modulus value to compensate for a difference between the fixed oscillator frequency and the reference frequency.

3. The apparatus of claim 2, wherein:
   the modulus value comprises a value related to the output frequency of the output signal; and
   the modulus compensator is configured to produce the compensated modulus value such that a relationship between the compensated modulus value and a version of the reference frequency is substantially similar to another relationship between the modulus value and the fixed oscillator frequency.

4. The apparatus of claim 3, wherein the modulus compensator is configured to produce the compensated modulus value such that a product of the compensated modulus value and the version of the reference frequency is approximately equal to another product of the modulus value and the fixed oscillator frequency.

5. The apparatus of claim 2, further comprising:
   a frequency divider coupled between the oscillating signal source and the frequency generator, the frequency divider configured to produce a version of the reference signal having a version of the reference frequency based on the reference signal having the reference frequency, wherein:
   the frequency generator is coupled to the oscillating signal source via the frequency divider; and
   the frequency generator is configured to generate the output signal having the output frequency based on the version of the reference signal and the compensated modulus value.

6. The apparatus of claim 5, wherein:
   the frequency divider is configured to produce the version of the reference signal having the version of the reference frequency based on the reference frequency and a frequency divider value; and
   the modulus compensator is configured to produce the compensated modulus value to compensate for a difference between the fixed oscillator frequency and the version of the reference frequency.

7. The apparatus of claim 1, wherein:
   the modulus value comprises at least one of an integer modulus value or a fractional modulus value;
   the compensated modulus value comprises at least one of a compensated integer modulus value or a compensated fractional modulus value; and
   the frequency generator is configured to operate with at least one of the compensated integer modulus value or the compensated fractional modulus value.

8. The apparatus of claim 1, wherein the modulus compensator comprises:
   a compensated modulus calculator coupled to the frequency estimator and configured to compute the compensated modulus value by dividing the modulus value by the estimated frequency.

9. The apparatus of claim 8, wherein the frequency estimator comprises:
   an edge detector coupled to the oscillating signal source and configured to detect pulse edges of the reference signal responsive to the reference frequency; and
   a counter coupled to the edge detector and configured to count the pulse edges detected by the edge detector to produce an edge count.

10. The apparatus of claim 9, wherein the frequency estimator further comprises:
a frequency determiner coupled to the counter and configured to determine the estimated frequency based on the edge count and a length of a period of the fixed oscillator frequency of the fixed-frequency oscillator signal.

11. The apparatus of claim 9, further comprising:
a frequency divider coupled between the oscillating signal source and the frequency generator, the frequency divider configured to produce a version of the reference signal having a version of the reference frequency based on the reference signal and a frequency divider value,
wherein the compensated modulus calculator is configured to compute the compensated modulus value based on the estimated frequency, the modulus value, and the frequency divider value.

12. The apparatus of claim 1, wherein the modulus compensator is configured to update the compensated modulus value repeatedly during operation of the apparatus.

13. The apparatus of claim 1, further comprising:
an integrated circuit including a modulus value register configured to store the modulus value,
wherein the integrated circuit includes the oscillating signal source, the frequency generator, and the modulus compensator.

14. The apparatus of claim 1, further comprising:
a fixed-frequency oscillator coupled to the modulus compensator, the fixed-frequency oscillator comprising a crystal oscillator configured to vibrate to produce the fixed-frequency oscillator signal at the fixed oscillator frequency.

15. The apparatus of claim 1, wherein the oscillating signal source comprises a voltage-based oscillating signal source configured such that the reference frequency of the reference signal is variable responsive to a variation in at least one of a process, a voltage, or a temperature.

16. The apparatus of claim 1, further comprising:
a low-power mode frequency synthesizer including the oscillating signal source, the modulus compensator, and the frequency generator; the output signal having the output frequency comprising a low-power mode output signal having a low-power mode output frequency; and
a high-power mode frequency synthesizer configured to accept another modulus value and another fixed-frequency oscillator signal having another fixed oscillator frequency, the high-power mode frequency synthesizer including another frequency generator configured to generate a high-power mode output signal having a high-power mode output frequency based on the other fixed-frequency oscillator signal having the other fixed oscillator frequency and the other modulus value.

17. The apparatus of claim 16, further comprising:
a multiplexer coupled to the low-power mode frequency synthesizer and the high-power mode frequency synthesizer and configured to receive the low-power mode output signal and the high-power mode output signal; the multiplexer configured to output, responsive to a power mode selection signal, a selected output signal selected between at least the low-power mode output signal and the high-power mode output signal; and
a power manager coupled to the multiplexer and configured to generate the power mode selection signal responsive to an operation currently being in a low-power mode or a high-power mode.

18. The apparatus of claim 1, wherein the frequency generator is configured to generate the output signal such that the output frequency is related to a product of the reference frequency and the compensated modulus value.

19. The apparatus of claim 18, wherein the frequency generator comprises at least one of:
an analog frequency-locked loop (FLL);
a digital frequency-locked loop (FLL);
an analog phase-locked loop (PLL); or
a digital phase-locked loop (PLL).

20. A system comprising:
an oscillating signal source configured to provide a reference signal having a reference frequency;
compensation means for producing a compensated modulus value to compensate for a difference between a fixed oscillator frequency of a fixed-frequency oscillator signal and the reference frequency of the reference signal based on a modulus value, the compensation means coupled to the oscillating signal source and configured to produce the compensated modulus value such that a relationship between the compensated modulus value and a version of the reference frequency is substantially similar to another relationship between the modulus value and the fixed oscillator frequency; and
frequency generation means for generating an output signal having an output frequency that is based on the reference frequency and the compensated modulus value, the frequency generation means coupled to the oscillating signal source and the compensation means.

21. The system of claim 20, wherein:
the compensation means comprises estimation means for estimating the reference frequency of the reference signal to produce an estimated frequency using the fixed oscillator frequency of the fixed-frequency oscillator signal; and
the compensation means is configured to produce the compensated modulus value based on the estimated frequency.

22. The system of claim 21, wherein the estimation means comprises:
detection means for detecting pulse edges of the reference signal; and
determination means for determining the estimated frequency using an edge count that is responsive to the pulse edges.

23. The system of claim 21, further comprising:
a frequency divider coupled between the oscillating signal source and the frequency generation means, the frequency divider configured to produce a version of the reference signal having a version of the reference frequency responsive to a frequency divider value,
wherein the compensation means is configured to produce the compensated modulus value based on the estimated frequency, the frequency divider value, and the modulus value.

24. A method for frequency synthesis to enable accelerated locking, the method comprising:
obtaining a reference signal having a reference frequency;
obtaining a fixed-frequency oscillator signal having a fixed oscillator frequency;
producing an estimation signal indicative of an estimated frequency based on the reference signal and the fixed-frequency oscillator signal, the estimated frequency representative of an estimate of the reference frequency of the reference signal;

producing a compensated modulus value, including dividing a modulus value by the estimated frequency;

providing the compensated modulus value and a version of the reference signal to a frequency generator; and generating, using the frequency generator, an output signal based on the compensated modulus value and the version of the reference signal.

25. The method of claim 24, wherein the generating comprises locking the frequency generator to a version of the reference frequency corresponding to the version of the reference signal using a feedback loop to generate the output signal having an output frequency.

26. The method of claim 25, wherein the generating comprises producing the output signal to have the output frequency be related to a product of the version of the reference frequency and the compensated modulus value.

27. The method of claim 26, wherein the product of the version of the reference frequency and the compensated modulus value is approximately equal to another product of the fixed oscillator frequency and the modulus value.

28. The method of claim 25, wherein the version of the reference signal comprises at least one of an unmodified version of the reference signal or a frequency-divided version of the reference signal.

29. An apparatus comprising:
a low-power mode frequency synthesizer including:
  an oscillating signal source configured to provide a reference signal having a reference frequency;
  a frequency divider coupled to the oscillating signal source, the frequency divider configured to produce a version of the reference signal having a version of the reference frequency based on the reference signal;
  a frequency estimator coupled to the oscillating signal source, the frequency estimator configured to produce an estimation signal indicative of an estimated frequency of the reference signal based on the reference signal and a fixed-frequency oscillator signal;
  a compensated modulus calculator coupled to the frequency estimator and configured to compute a compensated modulus value based on a division operation including the estimation signal and a modulus value; and
  a frequency generator coupled to the frequency divider and the compensated modulus calculator, the frequency generator configured to generate an output signal having an output frequency that is based on the version of the reference signal and the compensated modulus value.

30. The apparatus of claim 29, further comprising:
a multiplexer having a first input, a second input, a control input, and an output; the second input coupled to the frequency generator and configured to receive the output signal;
a high-power mode frequency synthesizer configured to synthesize another output signal, the high-power mode frequency synthesizer coupled to the multiplexer and configured to provide the other output signal to the first input; and
a power manager configured to provide a power mode selection signal, the power manager coupled to the multiplexer and configured to provide the power mode selection signal to the control input,
wherein the multiplexer is configured to provide at the output of the multiplexer a selected output signal from the first input or the second input responsive to the power mode selection signal.

* * * * *